US011024792B2

(12) United States Patent
Ramakers et al.

(10) Patent No.: US 11,024,792 B2
(45) Date of Patent: Jun. 1, 2021

(54) FABRICATION METHODS

(71) Applicant: Microsoft Technology Licensing, LLC, Redmond, WA (US)

(72) Inventors: Senja Ramakers, Delft (NL); Pavel Aseev, Novotroitsk (RU); Amrita Singh, Delft (NL); Jie Shen, Delft (NL); Leonardus P. Kouwenhoven, The Hague (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/258,025

(22) Filed: Jan. 25, 2019

(65) Prior Publication Data
US 2020/0243742 A1    Jul. 30, 2020

(51) Int. Cl.
*H01L 39/24* (2006.01)
*H01L 39/12* (2006.01)
*H01L 39/22* (2006.01)

(52) U.S. Cl.
CPC .............. *H01L 39/24* (2013.01); *H01L 39/12* (2013.01); *H01L 39/228* (2013.01)

(58) Field of Classification Search
CPC ........ H01L 39/24; H01L 39/12; H01L 39/228
See application file for complete search history.

(56) References Cited

U.S. PATENT DOCUMENTS

| 4,218,532 A | 8/1980 | Dunkleberger |
| D278,272 S | 4/1985 | Kojima et al. |

(Continued)

FOREIGN PATENT DOCUMENTS

| DE | 102017002616 | 9/2018 |
| JP | D1475166 | 7/2013 |

(Continued)

OTHER PUBLICATIONS

Ex Parte Quayle Action dated Jun. 27, 2019, from U.S. Appl. No. 29/605,045, 6 pp.

(Continued)

*Primary Examiner* — Julia Slutsker
(74) *Attorney, Agent, or Firm* — Klarquist Sparkman, LLP

(57) ABSTRACT

There is provided a method of selectively patterning a device structure. A hollow shadow wall is formed on a substrate. The hollow shadow wall is formed of a base lying on a surface of the substrate, and one or more side walls connected to the base. The one or more side walls extend away from the surface of the substrate and around the base to define an internal cavity of the hollow shadow wall. A device structure supported by the substrate adjacent to the shadow wall is selectively patterned by using a deposition beam to selectively deposit a layer of deposition material on the device structure. The deposition beam has a non-zero angle of incidence relative to a normal to the surface of the substrate and an orientation in the plane of the substrate's surface, such that the shadow wall prevents deposition on a surface portion of the device structure within a shadow region defined by the shadow wall. The one or more side walls of the hollow shadow wall are removed once the device structure has been selectively patterned, and thereby selectively patterning the device component.

20 Claims, 12 Drawing Sheets

(56) References Cited

U.S. PATENT DOCUMENTS

| | | |
|---|---|---|
| D284,084 S | 6/1986 | Ferrara |
| 5,128,662 A | 7/1992 | Failla |
| D333,574 S | 3/1993 | Ackeret |
| 5,294,869 A | 3/1994 | Tang et al. |
| 5,294,870 A | 3/1994 | Tang et al. |
| D356,548 S | 3/1995 | Bottcher et al. |
| 5,468,595 A | 11/1995 | Livesay |
| 5,652,179 A | 7/1997 | Strifler et al. |
| D426,548 S | 6/2000 | Cross et al. |
| D451,096 S | 11/2001 | Redmond |
| D451,505 S | 12/2001 | Iseki et al. |
| 6,517,996 B1 | 2/2003 | Chao et al. |
| D492,684 S | 7/2004 | Ozolins et al. |
| D500,037 S | 12/2004 | Ozolins et al. |
| D502,703 S | 3/2005 | Tsujimoto et al. |
| 6,882,524 B2 | 4/2005 | Ulla et al. |
| D504,889 S | 5/2005 | Andre et al. |
| 7,002,292 B2 | 2/2006 | Prakash |
| D533,552 S | 12/2006 | Kuroiwa et al. |
| D543,979 S | 6/2007 | Lee |
| 7,299,580 B2 | 11/2007 | Wang et al. |
| D557,259 S | 12/2007 | Hirsch |
| D557,698 S | 12/2007 | Lye |
| D558,460 S | 1/2008 | Yu et al. |
| 7,342,776 B1 | 3/2008 | Chan |
| D579,930 S | 11/2008 | Maskatia |
| D579,939 S | 11/2008 | Skillman et al. |
| D584,304 S | 1/2009 | Lin |
| D585,399 S | 1/2009 | Hwang |
| D585,401 S | 1/2009 | Otani |
| D592,625 S | 5/2009 | Hwang |
| 7,569,470 B2 | 8/2009 | Fernandez-Ceballos et al. |
| D601,353 S | 10/2009 | Sadler et al. |
| D603,398 S | 11/2009 | Watson et al. |
| D606,081 S | 12/2009 | Parker et al. |
| D606,082 S | 12/2009 | Parker et al. |
| D606,083 S | 12/2009 | Parker et al. |
| 7,633,218 B2 | 12/2009 | Cok |
| D609,705 S | 2/2010 | Andre et al. |
| D613,286 S | 4/2010 | Lee et al. |
| D615,527 S | 5/2010 | Hwang |
| D616,448 S | 5/2010 | Skillman et al. |
| D617,793 S | 6/2010 | Chiang et al. |
| D622,240 S | 8/2010 | Liu et al. |
| D626,437 S | 11/2010 | Lee et al. |
| D627,343 S | 11/2010 | Andre et al. |
| D627,777 S | 11/2010 | Akana et al. |
| D627,779 S | 11/2010 | Liao |
| D628,569 S | 12/2010 | Guo |
| D629,216 S | 12/2010 | Stoddard |
| D629,800 S | 12/2010 | Seong |
| D630,207 S | 1/2011 | Seong |
| D630,607 S | 1/2011 | Li |
| D631,469 S | 1/2011 | Demskie et al. |
| D631,474 S | 1/2011 | Green et al. |
| D632,687 S | 2/2011 | Seong |
| D632,688 S | 2/2011 | Seong |
| D633,090 S | 2/2011 | Andre et al. |
| D633,091 S | 2/2011 | Andre et al. |
| D636,768 S | 4/2011 | Chan et al. |
| D636,770 S | 4/2011 | Li |
| D637,596 S | 5/2011 | Akana et al. |
| D637,597 S | 5/2011 | Seong |
| D638,419 S | 5/2011 | Ishiharada |
| D638,833 S | 5/2011 | Chuang |
| D638,836 S | 5/2011 | Daniel |
| D639,266 S | 6/2011 | Delorenzo et al. |
| D639,802 S | 6/2011 | Brooks |
| D641,016 S | 7/2011 | Takahashi |
| D641,017 S | 7/2011 | Meng |
| D641,018 S | 7/2011 | Lee et al. |
| D642,563 S | 8/2011 | Akana et al. |
| D645,465 S | 9/2011 | Lin et al. |
| D646,902 S | 10/2011 | Woo et al. |
| D649,190 S | 11/2011 | Goodall |
| D650,380 S | 12/2011 | Ballout |
| D652,418 S | 1/2012 | Rashid et al. |
| D653,645 S | 2/2012 | Park |
| D654,074 S | 2/2012 | Wood et al. |
| D654,497 S | 2/2012 | Lee |
| D655,704 S | 3/2012 | Akana et al. |
| D656,136 S | 3/2012 | Lee |
| D656,137 S | 3/2012 | Chung et al. |
| 8,153,890 B2 | 4/2012 | Wenham et al. |
| D659,139 S | 5/2012 | Gengler |
| D659,692 S | 5/2012 | Jung et al. |
| 8,166,649 B2 | 5/2012 | Moore |
| D663,281 S | 7/2012 | Hwang |
| D664,540 S | 7/2012 | Kim et al. |
| D664,954 S | 8/2012 | Kim et al. |
| D665,370 S | 8/2012 | Chung |
| D667,397 S | 9/2012 | Koh |
| D667,398 S | 9/2012 | Koh |
| D667,399 S | 9/2012 | Koh |
| D667,825 S | 9/2012 | Jung |
| D668,650 S | 10/2012 | Han |
| D668,651 S | 10/2012 | Kim et al. |
| D669,069 S | 10/2012 | Akana et al. |
| D669,468 S | 10/2012 | Akana et al. |
| D670,286 S | 11/2012 | Akana et al. |
| D670,692 S | 11/2012 | Akana et al. |
| D671,514 S | 11/2012 | Kim et al. |
| D671,940 S | 12/2012 | Kim |
| D675,203 S | 1/2013 | Yang |
| D677,660 S | 3/2013 | Groene et al. |
| D678,271 S | 3/2013 | Chiu |
| D678,272 S | 3/2013 | Groene et al. |
| D678,877 S | 3/2013 | Groene et al. |
| 8,563,395 B2 | 10/2013 | Mi |
| D696,254 S | 12/2013 | Groene et al. |
| D705,776 S | 5/2014 | Groene et al. |
| D705,777 S | 5/2014 | Groene et al. |
| D705,778 S | 5/2014 | Groene et al. |
| D710,349 S | 8/2014 | Han et al. |
| D711,338 S | 8/2014 | Park et al. |
| D712,400 S | 9/2014 | Kim et al. |
| D712,867 S | 9/2014 | Vats |
| D713,403 S | 9/2014 | Groene et al. |
| D715,795 S | 10/2014 | McManigal |
| D716,608 S | 11/2014 | Tosin |
| D719,010 S | 12/2014 | Russo et al. |
| D719,564 S | 12/2014 | Ji et al. |
| D726,716 S | 4/2015 | Green et al. |
| D727,315 S | 4/2015 | Jensen et al. |
| D732,523 S | 6/2015 | Riddiford et al. |
| D733,120 S | 6/2015 | Lee et al. |
| D733,127 S | 6/2015 | Sung et al. |
| D734,326 S | 7/2015 | McManigal |
| D735,188 S | 7/2015 | Oh et al. |
| D741,319 S | 10/2015 | Yun et al. |
| D749,070 S | 2/2016 | Oh |
| D751,063 S | 3/2016 | Lin |
| D754,655 S | 4/2016 | Groene et al. |
| D758,984 S | 6/2016 | Maxwell et al. |
| D763,252 S | 8/2016 | Lee et al. |
| 9,447,513 B2 | 9/2016 | Mardilovich et al. |
| 9,459,665 B2 | 10/2016 | Chang et al. |
| D772,862 S | 11/2016 | Kwong et al. |
| 9,483,076 B2 | 11/2016 | Liang et al. |
| 9,540,855 B2 | 1/2017 | Kato |
| D782,469 S | 3/2017 | Raken et al. |
| D782,470 S | 3/2017 | Raken et al. |
| D782,471 S | 3/2017 | Nuk et al. |
| D782,473 S | 3/2017 | Hong et al. |
| D783,625 S | 4/2017 | Okuley |
| 9,729,683 B2 | 8/2017 | Okuley |
| D798,292 S | 9/2017 | Groene et al. |
| 9,799,796 B2 | 10/2017 | Herner et al. |
| D807,348 S | 1/2018 | Wang et al. |
| D807,878 S | 1/2018 | Kim et al. |
| 9,873,937 B2 | 1/2018 | Lee et al. |
| D820,253 S | 6/2018 | Kim et al. |
| D824,898 S | 8/2018 | Xu |
| D827,605 S | 9/2018 | Yao |

(56) References Cited

U.S. PATENT DOCUMENTS

| | | | |
|---|---|---|---|
| D834,009 | S | 11/2018 | Itou |
| D834,917 | S | 12/2018 | Alberti et al. |
| D835,097 | S | 12/2018 | Morgan |
| D845,947 | S | 4/2019 | Raken et al. |
| 10,629,798 | B1 | 4/2020 | Kallaher et al. |
| 2003/0118950 | A1 | 6/2003 | Chao et al. |
| 2005/0052831 | A1 | 3/2005 | Chen |
| 2006/0237599 | A1 | 10/2006 | Temus et al. |
| 2007/0069273 | A1 | 3/2007 | Rohr |
| 2011/0020979 | A1 | 1/2011 | Forrest et al. |
| 2011/0151190 | A1 | 6/2011 | Chung et al. |
| 2011/0165327 | A1 | 7/2011 | Park et al. |
| 2012/0140396 | A1 | 6/2012 | Zeliff et al. |
| 2012/0194448 | A1 | 8/2012 | Rothkopf |
| 2012/0229970 | A1 | 9/2012 | Hsu |
| 2013/0299783 | A1 | 11/2013 | Lutchyn et al. |
| 2018/0090662 | A1 | 3/2018 | Stevenson et al. |
| 2018/0358537 | A1 | 12/2018 | Brink et al. |
| 2018/0358538 | A1* | 12/2018 | Brink ............... H01L 39/12 |
| 2019/0131513 | A1 | 5/2019 | Krogstrup et al. |
| 2020/0027919 | A1 | 1/2020 | Van Hoogdalem et al. |

FOREIGN PATENT DOCUMENTS

| | | |
|---|---|---|
| JP | D1486541 | 12/2013 |
| KR | 300631455 | 2/2012 |
| KR | 2012-0092431 | 8/2012 |
| KR | 300687331 | 4/2013 |
| KR | 3008018220001 | 6/2015 |
| KR | 10-1757736 | 7/2017 |
| WO | WO 2009/029302 | 3/2009 |
| WO | 2017217961 A1 | 12/2017 |
| WO | WO 2019/001753 | 1/2019 |

OTHER PUBLICATIONS

Ex Parte Quayle Action dated Dec. 31, 2018, from U.S. Appl. No. 29/605,049, 7 pp.

Hachman, "Surface Pro is Microsoft's Long-Awaited Surface Pro 4 Upgrade, Restyled as a Laptop," downloaded from World Wide Web, 5 pp. (May 2017).

Office action dated Aug. 3, 2018, from Japanese Patent Application No. 2017-502096, 7pp.

Office action dated Aug. 3, 2018, from Japanese Patent Application No. 2017-502097, 7 pp.

Office action dated Aug. 17, 2018, from Japanese Patent Application No. 2017-502098, 7 pp.

Das Kanungo et al., "Selective area growth of III-V nanowires and their heterostructures on silicon in a nanotube template: towards monolithic integration of nano-devices," Nanotechnology, vol. 24, No. 22, 5 pp. (May 2013).

International Search Report and Written Opinion dated Aug. 29, 2019, from International Patent Application No. PCT/US2018/057841, 20 pp.

Krogstrup et al., "Epitaxy of semiconductor-superconductor nanowires," Nature Materials, vol. 14, No. 4, pp. 400-406 (Apr. 2015).

Lutchyn et al., "Realizing Majorana zero modes in superconductor-semiconductor heterostructures," arXiv:1707.04899v1, 18 pp. (Jul. 2017).

Shabani et al., "Two-dimensional epitaxial superconductor-semiconductor heterostructures: A platform for topological superconducting networks," Physical Review B, vol. 93, pp.

Application as Filed on Dec. 5, 2019, in International Patent Application No. PCT/EP2019/083906, 32 pp.

Ariel-Sternberg, "PMMA Resist Processing Standard Operating Procedure," Columbia University, Columbia Nano Initiative, downloaded from https://static1.squarespace.com/static/57b26cc76b8f5b7524bf9ed2/t/59272752d2b857857ae994c6/1495738198009/PMMA_Process_SOP_May2017.pdf, 6 pp. (downloaded on Mar. 26, 2020).

Aseev et al., "Selectivity Map for Molecular Beam Epitaxy of Advanced III-V Quantum Nanowire Networks," Nano Letters, vol. 19, pp. 218-227 (Dec. 2018).

Communication pursuant to Rules 161(1) and 162 EPC dated Jun. 12, 2020, from European Patent Application No. 18800020.2, 3 pp.

Davies et al., "Selective Area Growth of III-V Semiconductors by Chemical Beam Epitaxy: Study of Reaction Mechanisms," SPIE Proc. Epitaxial Growth Processes, pp. 58-67 (May 1994).

Fahed, "Seletive Area Growth of In-Plane III-V Nanostructures using Molecular Beam Epitaxy," Ph.D. Thesis, Universite de Lille, 140 p. (Nov. 2016).

Fan et al., "Semiconductor Nanowires: From Self-Organization to Patterned Growth," Small, vol. 2, No. 6, pp. 700-717 (Jun. 2006).

Fukui et al., "GaAs tetrahedral quantum dot structures fabricated using selective area metalorganic chemical vapor deposition," Applied Physics Letters, vol. 58, No. 18, 4 pp. (May 1991).

Goh, "Selective Area Growth and Characterization of Gan Based Nanostructures by Metal Organic Vapor Phase Epitaxy," Ph.D. Thesis, Georgia Institute of Technology, pp. 1-121 (May 2013).

International Search Report and Written Opinion dated Jun. 25, 2020, from International Patent Application No. PCT/US2020/014202, 20 pp.

International Search Report and Written Opinion dated Jul. 22, 2020, from International Patent Application No. PCT/US2019/069024, 10 pp.

Krizek et al., "Field effect enhancement in buffered quantum nanowire networks," Physical Review Materials, vol. 2, Issue 9, pp. 1-15 (Sep. 2018).

Krizek, "Semiconductor Nanowire Networks Grown by Molecular Beam Epitaxy," Ph.D. Thesis, University of Copenhagen, pp. 1-190 (Jul. 2018).

Notice of Allowance dated Dec. 16, 2019, from U.S. Appl. No. 16/246,289, 9 pp.

Office Action dated May 21, 2020, from U.S. Appl. No. 16/484,088, 7 pp.

Pfeiffer Vacuum GmbH, "1.2.5 Mean free path," downloaded from https://www.pfeiffer-vacuum.com/en/know-how/introduction-to-vacuum-technology/fundamentals/mean-free-path/, 8 pp. (downloaded on Mar. 26, 2020).

Schallenberg, "Shadow Mask assisted Heteroepitaxy of Compound Semiconductor Nanostructures," Ph.D. Thesis, The Julius Maximilian University of Würzburg, pp. 1-135 (Oct. 2004).

Serban, "Self-Assembled and Selective-Area Growth of Group III-Nitride Semiconductor Nanorods by Magnetron Sputter Epitaxy," Ph.D. Thesis, Linkoping University, pp. 1-66 (May 2018).

Shin-Etsu MicroSi, Inc., "The Difference Between Positive and Negative Photoresist," downloaded from https://www.microsi.com/the-difference-between-positive-and-negative-photoresist/, 2 pp. (Mar. 2013).

Wikipedia, "Evaporation (deposition)," downloaded from https://en.wikipedia.org/wiki/Evaporation_(deposition), 4 pp. (document marked: "last edited on Feb. 15, 2020").

Non-final Office action issued in U.S. Appl. No. 16/484,088, dated Oct. 9, 2020, 8 pages.

Aleksandrs et al., "Air-Suspended SU-8 Strip Waveguides With High Refractive Index Contrast," IEEE Photonics Technology Letters, 28:1862-1865 (Sep. 1, 2016). 1 I.

Liu et al., "Top-Down Fabrication of Nanostructures," Nanotechnology, vol. 8: Nanostructured Surfaces, 48 pages (2010).

Lyu et al., "Downscaiing Metal-Oxide Thin-Film Transistors to Sub-50 nm in an Exquisite Film-Profile Engineering Approach," IEEE Transactions on Electron Devices, 64:1069-1075 (Mar. 2017).

International Search Report and Written Opinion issued in International Application No. PCT/EP2020/055338, dated Nov. 2, 2020, 15 pages.

International Search Report and Written Opinion issued in International Application No. PCT/US2019/064705, dated Sep. 28, 2020, 18 pages.

\* cited by examiner

Step 5

Topview

Step 6

Step 7

Step 5

Step 6

FABRICATION METHODS

TECHNICAL FIELD

This application relates to the fabrication of structures such as nanoscale devices by means of selective material deposition. An example application is the fabrication of superconductor-semiconductor platforms, such as semiconductor-superconductor platforms for use in quantum computers.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. Regarding the latter, a key advance in the field was the realization that non-abelian anyons, in the form of "Majorana zero modes" (MZMs) can be formed in semiconductor (SE) nanowires (NWs) coupled to a superconductor (SU).

One of the issues encountered in the context of SE/SU nanowires is the existence of so-called "soft gap" states. The soft gap issue has been documented in publicly-available literature, and suffice it to say that these soft gap states, when present, are a source of decoherence for the MZMs. Analysis and experiments indicate that a source of the soft gap is disorder in the SE/SU interface, and there has been recent work in the field on improving the quality of the SE/SU interface with the aim of providing more stable MZMs.

SUMMARY

According to a first aspect of the present invention, there is provided a method of selectively patterning a device structure. A hollow shadow wall is formed on a substrate. The hollow shadow wall is formed of a base lying on a surface of the substrate, and one or more side walls connected to the base. The one or more side walls extend away from the surface of the substrate and around the base to define an internal cavity of the hollow shadow wall. A device structure supported by the substrate adjacent to the shadow wall is selectively patterned by using a deposition beam to selectively deposit a layer of deposition material on the device structure. The deposition beam has a non-zero angle of incidence relative to a normal to the surface of the substrate and an orientation in the plane of the substrate's surface, such that the shadow wall prevents deposition on a surface portion of the device structure within a shadow region defined by the shadow wall. The one or more side walls of the hollow shadow wall are removed once the device structure has been selectively patterned, and thereby selectively patterning the device component.

In embodiments, the hollow shadow wall may be formed by the deposition of at least one wall material in an area of the substrate's surface left exposed by a partial resist layer on the substrate's surface. The partial resist layer has a top-surface and at least one inner side-surface extending from the top-surface to the substrate's surface, so as to create a boundary of the exposed area. The partial resist layer may be removed once the hollow shadow wall has been formed.

For example, the hollow shadow wall may be formed from at least one deposited layer of the wall material, which covers the top-surface of the partial resist layer, the inner side-surface of the partial resist layer and the exposed area of the substrate's surface. The one or more side walls of the hollow shadow wall may comprise the wall material covering the inner side-surface of the partial resist layer prior to its removal and the base of the hollow shadow wall comprising the wall material covering the exposed area of the substrate's surface. The wall material covering the top-surface of the partial resist layer may be removed with the partial resist layer leaving the hollow shadow wall supported by the substrate.

This is a particularly effective way of forming thin shadow walls with side walls which can be easily removed after they have served their purpose using purely mechanical methods which have benefits over other removal methods, such as chemical methods (see below).

According to a second aspect of the present invention, there is provided a method of selectively patterning a device component. A partial layer of resist is formed on a surface of a substrate which leaves at least one area of the substrate surface exposed. The partial resist layer has a top-surface lying substantially parallel to the substrate's surface and an inner side-surface extending from the top-surface to the substrate's surface, so as to create a boundary of the exposed area where the side-surface meets the substrate's surface. A shadow wall is formed in the exposed area from wall material deposited on the inner side-surface of the resist layer. The wall material extends to the exposed area of the substrate surface for supporting the shadow wall when the resist layer is removed which surrounds it. The partial resist layer is removed from the substrate thereby leaving the shadow wall supported by the substrate. A deposition beam is used to selectively deposit a layer of deposition material on a device component supported by the substrate adjacent to the shadow wall. The deposition beam has a non-zero angle of incidence relative to a normal to the surface of the substrate and an orientation in the plane of the substrate's surface, such that the shadow wall prevents deposition on a surface portion of the device component within a shadow region defined by the shadow wall.

According to a third aspect of the present invention, there is provided a method of selectively patterning a device structure. A shadow wall is formed on a surface of a substrate, the shadow wall comprising one or more side walls extending away from the surface of the substrate. The one or more side walls have at least one serrated region which increases the rigidity of the one or more side walls. A deposition beam is used to selectively deposit a layer of deposition material on a device structure supported by the substrate adjacent to the shadow wall. The deposition beam has a non-zero angle of incidence relative to a normal to the surface of the substrate and an orientation in the plane of the substrate's surface, such that the shadow wall prevents deposition on a surface portion of the device structure within a shadow region defined by the shadow wall, thereby selectively patterning the device structure.

DETAILED DESCRIPTION OF EMBODIMENTS

Figure 1:
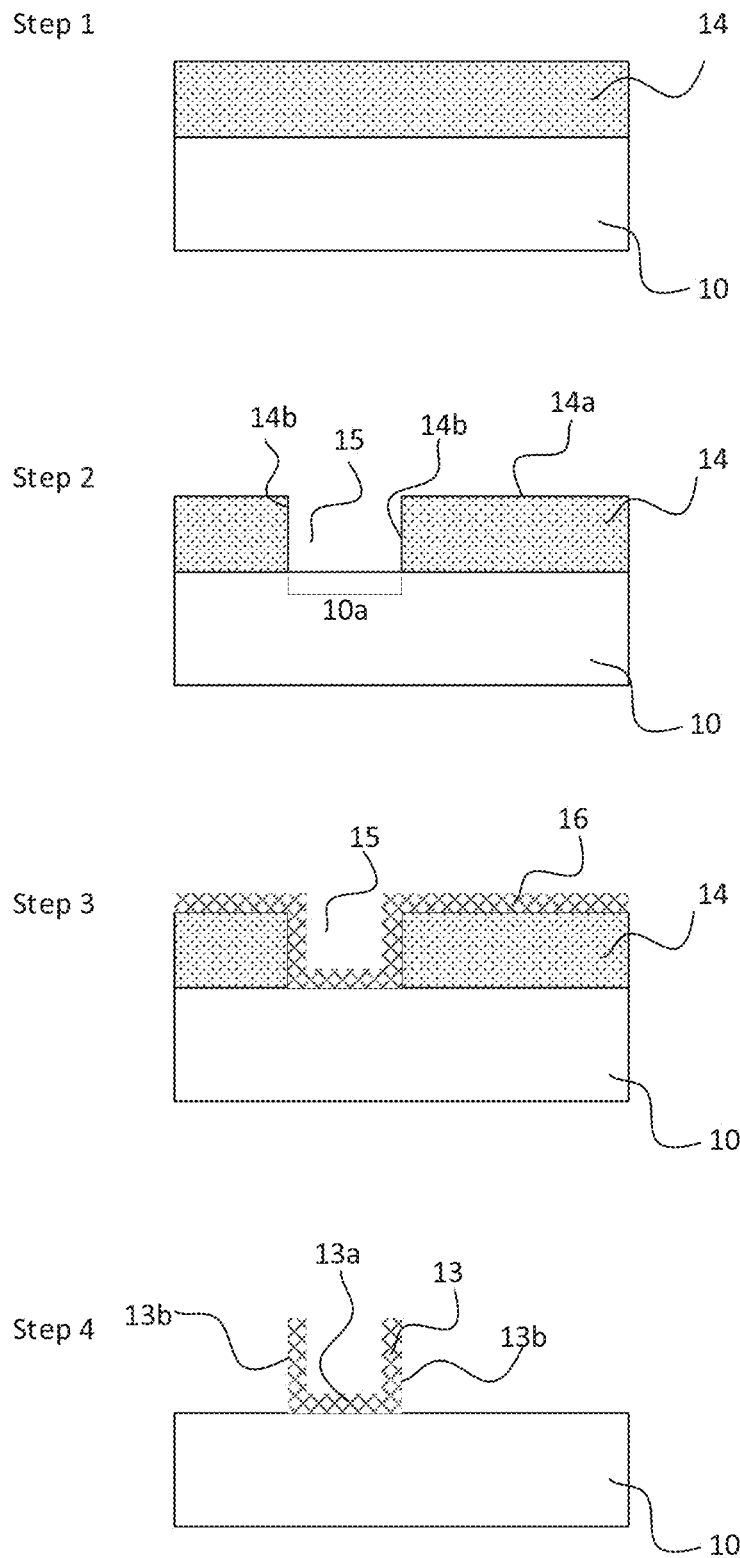
FIG. 1 shows example method for fabricating hollow shadow walls.
Figure 1:
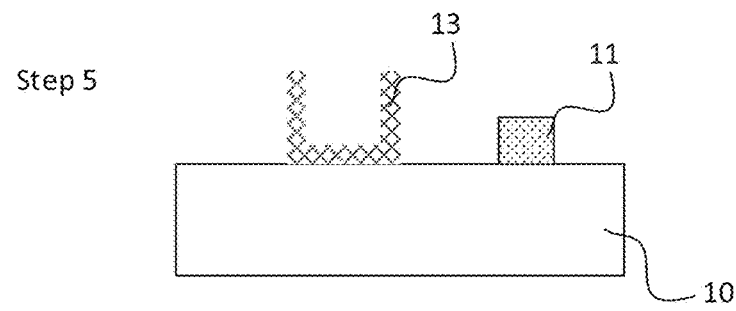
Figure 1:
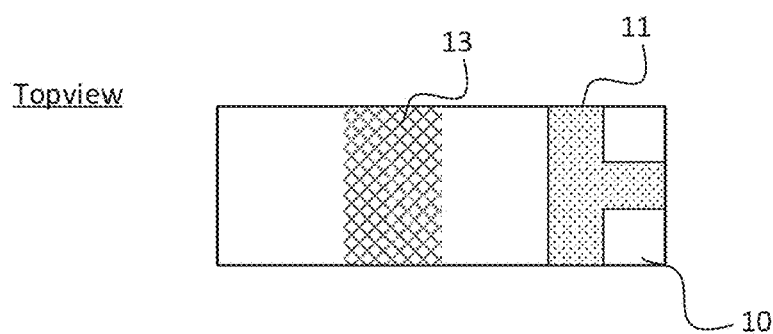
Figure 1:
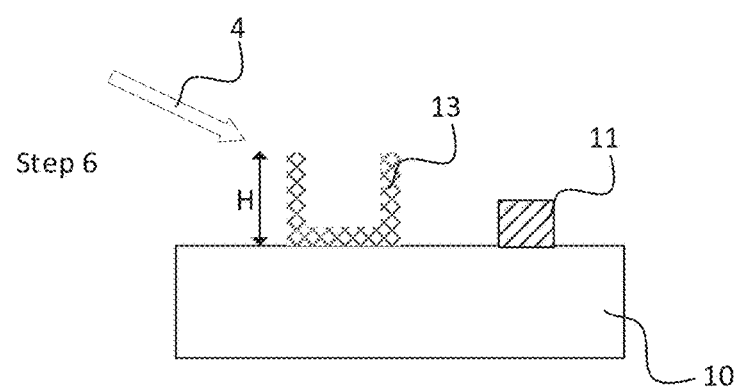
Figure 1:
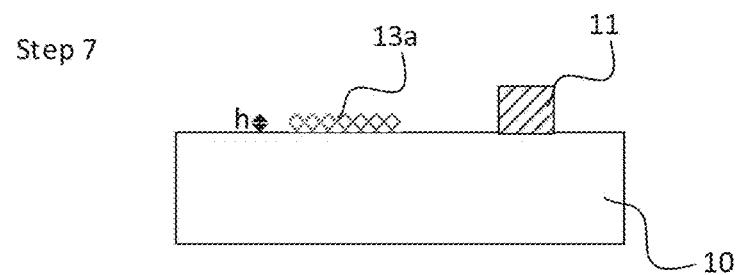

In the examples of fabrication technology described herein, purpose-built structures are used to cast "shadows" that create patterned nanoscale structures during a directional deposition of material on a substrate. The terms "shadow wall", "smart wall" or simply "wall" may be used interchangeably herein to refer to such structures, which protrude outwardly of the substrate. This allows predefined regions of the substrate to be excluded from the deposition of the material, thereby creating nanoscale patterns. Such regions may be referred to as "shadow regions", these being regions in which deposition is prevented because the shadow walls inhibit the passage of the deposition material into those regions. These regions are exposed regions of the surface of the substrate adjacent the shadow walls (i.e. they are next to the shadow walls on the surface of the substrate, not underneath them). The deposition is performed using an angled beam, and because the shadow walls protrude outwardly from the surface of the substrate, they selectively prevent deposition in exposed shadow regions adjacent the opposite sides of the shadow walls to which the beam is incident.

Herein, an improved shadow wall structure and suitable fabrication process is described, which has various benefits over alternative smart wall structures and fabrication methods.

By way of example, one such alternative shadow wall fabrication method uses a thick dielectric layer which is etched to form the walls which can then be used as shadow structures for selective material angled deposition. This example process has a number of characteristics:

Wall height is defined by the thickness of the dielectric layer. This requires long runs of material deposition as well as etching process in case of tall walls, in order to build up a sufficiently thick layer of dielectric uniformly across the substrate surface and then selectively etch it away.

It results in walls composed of monolithic pieces of material, which are hard to remove from the substrate without damaging surrounding structures, which could be detrimental to the final device quality, after they serve their purpose. Non-removable walls can cause problems during the later stages of device fabrication.

This example process imposes certain limits on the substrate material.

The embodiments of smart wall technology disclosed herein addresses all of the above.

The described embodiments provide "hollow" smart walls and an example process for fabricating hollow smart walls. Hollow smart walls—that is, smart walls having relatively large internal cavities—are significantly easier to remove than monolithic (solid) smart walls of corresponding size and shape.

There are various ways to create hollow smart walls with the desired characteristics. The example process described below uses a partial resit layer, in which smart walls are formed in regions of the substrate left exposed by the partial resist layer. A thin layer of wall material is deposited uniformly over the substrate surface and the surface of the resist layer—both its vertical top-surface and its vertical side-surfaces extending down to and surrounding the exposed regions of the substrate (horizontal and vertical meaning the directions parallel and perpendicular to the plane of the substrate irrespective of the direction of gravity). A single wall material can be used, or multiple wall materials can be built up in layers to form a composite smart wall.

The hollow smart walls are formed by the horizontally-aligned wall material deposited on the exposed region together with the vertically-aligned wall material deposited on the surrounding side-surfaces of the resit. When the partial layer is removed, the wall material on its top-surface is removed with it, however the thin layer of wall material on each exposed region of the substrate surface extending up the surrounding side-surfaces of the resist layer remains to leave hollow shadow walls supported by the substrate.

This requires only a thin layer of wall materials to be deposited and removes the need for etching—addressing point (1) above.

In the present disclosure, the term substrate is used in this context to refer to a wafer 10 plus any structure formed on the wafer 10. That is to say, for the present purposes the "wafer" will be taken herein to refer to the base layer, and the "substrate" will refer to the wafer plus any other layers already deposited over the wafer at the current stage in the fabrication process, including smart walls, masks, deposited material etc. It is noted however that references to layers, components, structures etc. on a wafer does not necessarily mean those layers/components/structures etc. have to be in direct contact with the surface of the wafer unless otherwise indicated (so in a multi-layered substrate, all of those layers are said to be on the wafer).

FIG. 1 shows a schematic diagram of the method of producing shadow walls 13. In this example, a device 11 on which a deposition material 4 it to be deposited in order to create nanoscale patterns is gown externally of the substrate and placed on the wafer 10. The device may be a semiconducting nanowire.

At step 1, a layer of resist 14 is formed on the wafer 10. The resit 14 may be an electron beam resist, for example. The depth of the layer of resist 14 determines the height of the shadow walls 13 which are produced via this method, thus the depth of the layer 14 corresponds to the required depth of the walls 13. The layer of resist 14 may be formed via spin-coating, such that the layer is of substantially equal depth over the surface of the substrate 10. A single resist spin may, for example, produce a layer which is about 0.5 µm in depth, so resulting in shadow walls 13 of about this depth. Taller walls may be produced by performing multiple resist spins, for example, such that the resultant shadow walls 13 are approximately 1.5 µm in depth. The desired pattern to be formed from the deposition of the material 4 and the angle from which the materials will be deposited determines the required height, as well as the shape, of the shadow walls 13.

Figure 2:
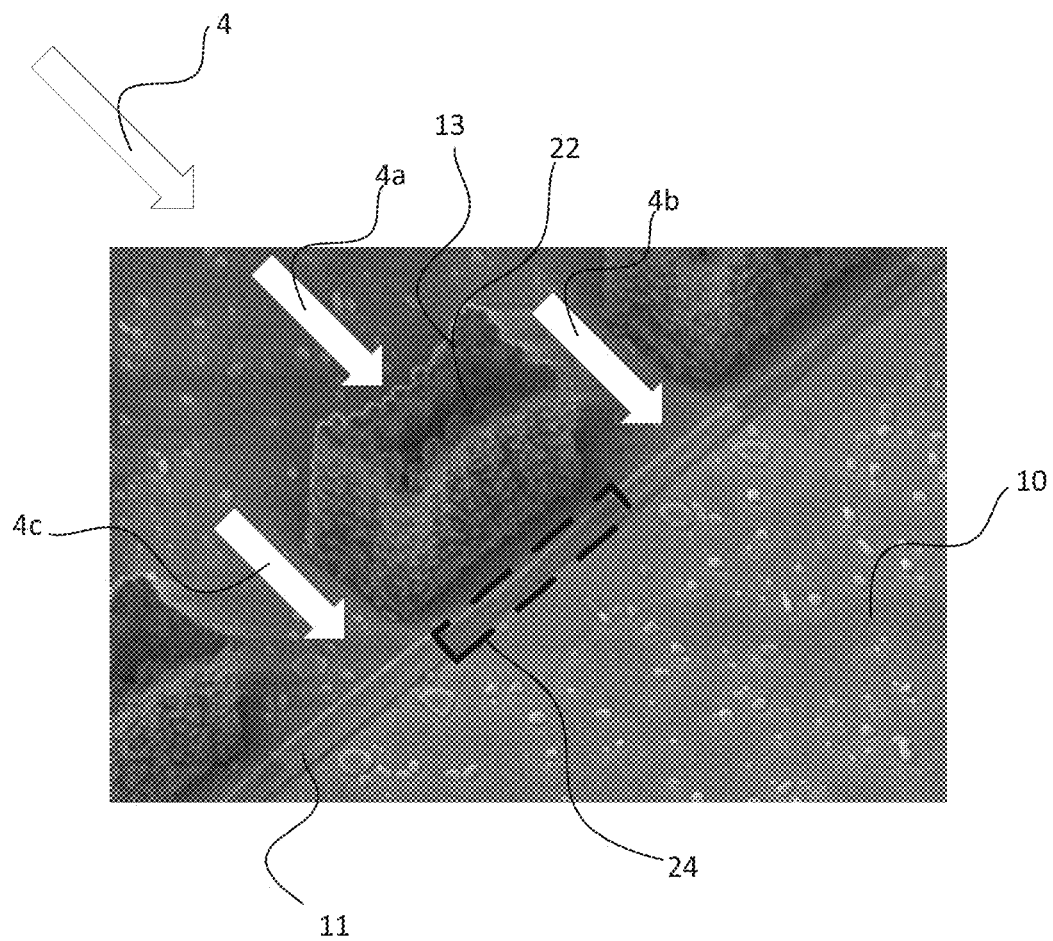
FIG. 2 shows selective deposition which uses smart walls to generate desired patterns.

At step 2, part of the layer of resist 14 is selectively removed to form a partial layer of resist over the wafer 10. In the example of FIG. 2, only one area is selectively removed, but it will be appreciated that more than one area may be removed at this step. The layer of resist 14 is removed to create a cavity 15 such that a region 10a of the surface of the wafer is exposed. The cavity 15 is defined by inner side-surfaces 14b of the partial resist layer 14 which extend from the surface of the wafer 10 to the top-surface 14a of the resist layer 14. These side-surfaces form a boundary around the exposed area 10a of the wafer 10.

The resit may be selectively removed via lithography. The layer 14 is exposed to an electron beam which defines the areas which are to be removed. The effect of the electron beam is to alter the solubility of the resist to a resist developer. For a positive resist, the electron beams are targeted at the areas which are to be removed such that these areas become soluble in the developer, whereas for a negative resist, the areas of the resist 14 which are not to be removed are exposed to the electron beam such that the resist 14 in these areas becomes insoluble in the developer. After the resist 14 has been exposed to the electron beam, it is developed in the resist developer. Any residual resist 14 remaining in the cavity 15 is removed using a descum process, which is known in the art.

At step 3, a layer of wall material 16 is deposited via non-directional deposition on the surface of the substrate. The wall material may, for example, be silicon nitride. The layer of wall material 16 is deposited such that it covers the exposed surface of the wafer 10 in the cavity 15 and the side-surfaces of the resist 14 in the cavity 15. The layer of wall material 16 may also cover the top surface of the resist 14. The thickness of the layer of wall material 16 is determined by the required thickness of the shadow walls 13. The thickness of the layer of wall material is substantially uniform over the side-surfaces of the layer of resist 14 and the exposed surface of the substrate 10 in the cavity 15. In some instances, the thickness of the layer of wall material may not be uniform. For example, it has been found that the thickness of the layer can be as high as 50% non-uniformity and still produce adequate hollow shadow walls.

An advantage of fabricating shadow walls 13 using this method is that only a thin layer of wall material needs to be deposited. When shadow walls are made by depositing a layer of wall material and then etching the required wall pattern, the deposited layer of wall material must be as thick as the required height of the shadow walls, so long runs of wall material deposition are required. Since the method of wall fabrication of FIG. 1 does not require etching, the risk of damaging the surface of the wafer 10 by etching is also removed.

At step 4, the remaining resit 14 is removed from the wafer 10 to leave the shadow wall 13 supported by the wafer 10. Any wall material which was deposited on the top surface of the resist 14 is removed along with the resist 14. This then leaves a hollow shadow wall 13 standing in the location of cavity 15. The hollow shadow wall 13 comprises a base 13a formed of the wall material in the region 10a that was previously left exposed by the (now removed) partial resist layer 14, and side walls 13b formed from the wall material that was previously covering the inner side-surface 14b of the partial resit layer 14. The thickness of the side walls 13b is defined by the thickness of the wall material layer 16, and a thin layer of wall material means thin side walls 13b that are easy to remove once they have served their purpose.

The resist 14 may be removed via lift-off, which is known in the art. Acetone may, for example, be used as the lift-off solvent. Since the hollow shadow walls 13 are fragile and rigid, it may be desirable to remove the resit layer 14 by a method which does not expose the wafer to vibrations. Lift-off using acetone, for example, often requires stirring, so may result in the walls 13 collapsing. An alternative method for removing the resist layer 14 may be critical point drying.

After lift-off, plasm cleaning may be used to remove impurities from the surface of the wafer 10. Oxygen plasma treatment may be used in this process. It will be appreciated that oxygen plasma treatment is not always required. In cases where oxygen plasma treatment is used, the surface of the wall 13 may be oxidised. For example, silicon nitride is converted to silicon oxide, such that a thin layer of silicon oxide coats the surface of the wall 13. By removing the resist 14 without etching, the risk of damaging the surface of the substrate during etching is removed.

In some embodiments, the wall 13 may be formed of a composite material. This may be used to, for example, compensate for different stresses in the wall material used. To create a composite wall, the step of depositing the wall material (step 3 in FIG. 1) is repeated to create a wall 13 formed of layers of different materials. It will be appreciated that more than two different materials may be used to create the walls 13, and that the different materials used for the walls 13 may be deposited in two or more different layers. The materials used and the layering of the materials may be dependent upon the material deposition process, which is described later.

In some embodiments, composite hollow shadow walls may be formed by depositing two or more different wall materials from two or more different angles, such that a single layer of wall material is formed of two or more different parts, each part extending the full thickness of the layer.

In step 5, the device 11 is placed on the wafer 10 at the desired location. The device 11 may be grown externally to the substrate and then transferred to the substrate when required. This may occur after the shadow walls 13 have been fabricated, as in this example, or the device 11 may be transferred to the wafer 10 before the shadow walls 13 are fabricated. If either the device 11 or the wafer 10 has been exposed to the atmosphere before the device 11 is transferred onto the wafer 10, the surfaces may be cleaned. Cleaning the surfaces removes impurities so that the electrical contact between the wafer 10 and the device 11 is improved, such that there is less degradation of signals as they pass through the structure when in use. An example top-down view of this set-up is also shown.

In step 6, the deposition material 4 is deposited on the substrate via directional deposition. The shadow wall 13 creates shadow regions on the device 11 in which no material 4 is deposited. As such, a nanoscale pattern of the deposition material 4 is formed on the surface of the device 11, the pattern defined by the shadow region.

The material 4 may be a superconductor such as aluminium. This may be stored as a solid in source cells and evaporated in order to be projected at the device 11. By coating the semiconductor device 11 with a superconducting material 4 such as aluminium, a network of semiconductor-superconductor nanowires may be created.

One or more additional depositions may follow. The material 4 deposited in the subsequent depositions may be the same material 4 as in the first deposition, or the material 4 may vary with each deposition. For example, a dielectric may be deposited on the device 11 in a second deposition. The angle at which the material 4 is deposited may also vary with each deposition. By varying the angle, different patterns can be created on the device 11 using the same shadow walls 13.

In step 7, following step 6, the thin side walls 13b of the shadow wall 13 can be easily removed using mechanical methods (e.g. ultrasonification), without damaging the device 11 (in the way that e.g. chemical removal might), once they have served their purpose.

Prior to the removal of the side walls 13b, the shadow wall 13 has a height H defined by the thickness of the resist layer 14 (since removed). The base 13a, on the other hand, has a smaller height h defined by the thickness of the layer of wall material 16.

The base 13a may remain on the substrate, but its impact is relatively minimal due to its relatively small size and low height—in contrast to a monolithic shadow wall of full height H.

FIG. 2 shows a perspective view of step 6 as described above. The material 4 is deposited on the substrate in the direction indicated by the arrows. The hollow shadow wall 13, which has an internal cavity 22, prevents the material 4a from being deposited on the device 11 in the shadow region 24. The material 4b, 4c, however, is able to be deposited on the device 11 since the shadow wall 13 does not block its path. Thus, the surface of the device 11 remains exposed in the shadow region 24 but is covered by material 4 in other areas.

Smart walls generally are an alternative to using hard masks or resist for defining patterns and subsequent etching, and have a number of benefits over such techniques.

Traditional lithography techniques use chemical etching to create nanoscale patterns. However, chemical contact with a device region can lead to degradation of the surface properties of the patterned material, resulting in lower device quality. In contrast to such techniques, the described technology does not require any contact of chemicals with the device region in embodiments where a nanostructure to be patterned is grown on the substrate, which prevents unwanted modifications to the contact surface during patterning. In embodiments where the nanostructure is transferred to the substrate, native oxide may need to be removed from the surface of the wire before the structures can be built up on the wire. This can be achieved by employing hydrogen plasma or thermal de-oxidation in a vacuum or gaseous atmosphere.

Externally growing and transferring the nanowires is beneficial in some respects as there are much less strict material requirements in that event. This is because the shadow walls and the growth of nanostructures are independent steps.

Hard stencil masks could also be used to create nanostructures. However, precise mechanical positioning of a mask is required, which requires the introduction of complex additional machinery in the deposition chamber. Moreover, in the case that multiple depositions are needed for a single device, a new stencil mask is required for each new deposition which significantly increases the complexity of the process and the potential for error. By contrast, the described embodiment's use lithographic positioning of the shadow walls that enable selective deposition. This is both more accurate and easier to implement than deposition using hard masks.

The deposited material may for example be a superconductor, metal, or dielectric. Some example materials are mentioned herein, but it will be appreciated that other materials may be used.

The material may be deposited or partially deposited on a nanoscale device, such as a semiconductor nanowire. By way of example, semiconductor nanowires wires with a coating (or partial coating) of superconductor material have applications in topological quantum computing. The described technology can be used to selectively deposit a superconductor on one or more semiconductor nanowires or complex networks of nanostructures, in order to create quantum circuits that may be used in a quantum computer. However, the described techniques can also be applied more generally to the fabrication of nanostructures which have practical uses in other contexts.

Figure 3:
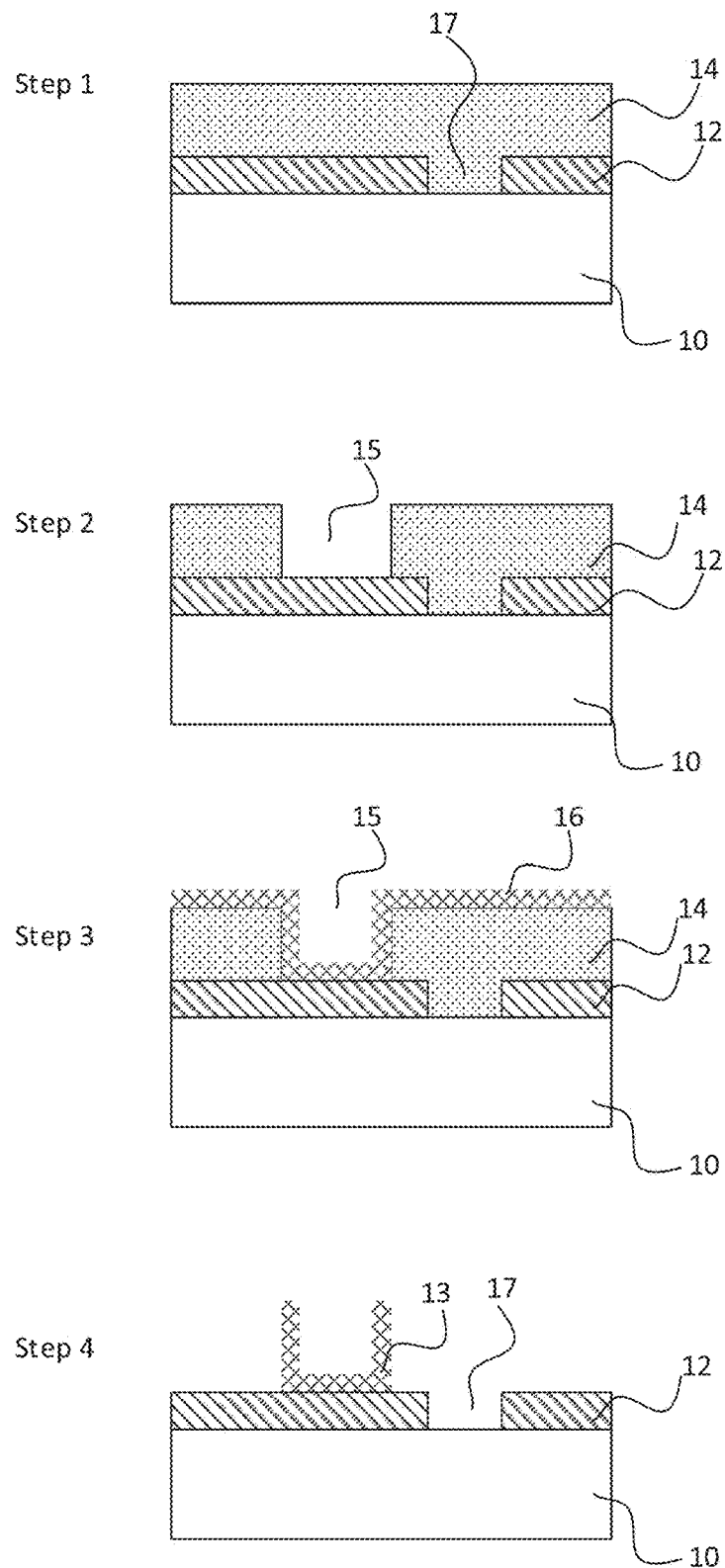
FIG. 3 shows an example method for fabricating hollow shadow walls when the device is gown via SAG.
Figure 3:
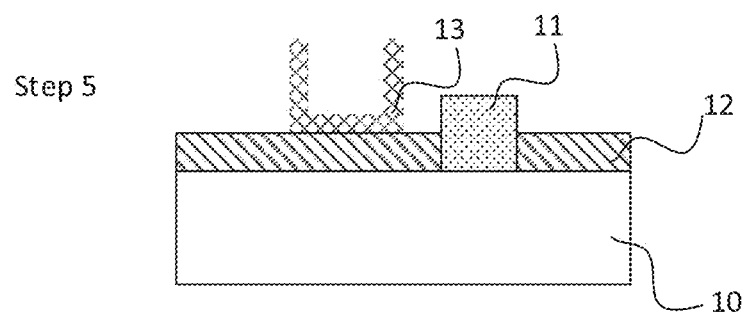
Figure 3:
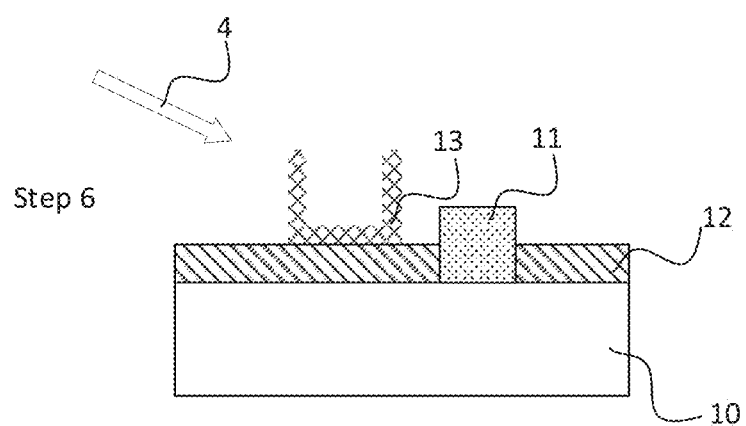

FIG. 3 shows an example method of fabricating hollow shadow walls 13 when the device 11 is to be grown via selective area growth (SAG) after the shadow walls 13 have been created. For this, a mask 12 has been formed on the surface of the substrate 10. This mask 12 may, for example, be made of a dielectric. The mask 12 contains a gap 17 in which the device 11 is to be grown. The gap 17 extends from the surface of the mask 12 to the surface of the wafer 10, such that the grown device 11 is in contact with the surface of the wafer 10.

Steps 1 to 4 of the method of FIG. 3 follow the steps 1 to 4 of the method of FIG. 1:

A layer of resist 14 is deposited on the substrate. This layer sits atop the mask 12, and fills the gap 17. A portion of the resist layer 14 is selectively removed to leave the cavity 15, in which the hollow shadow wall 13 is to be fabricated. In this example, the resist 14 is only removed such that the surface of the mask 12 is exposed. A thin layer of wall material 16 is then deposited such that it covers the side-surfaces of the resist layer 14 and the exposed surface of the mask 12 in the cavity 15. The remaining resist layer 14 and the wall material 16 deposited on top of the resist are removed via lift-off. This leaves the hollow shadow wall 13 standing alone, and the surface of the wafer 10 in the gap 17 exposed.

In step 5, the device 11 is grown via SAG in the gap 17 such that the device 11 is in contact with the surface of the wafer 10. The surface of the wafer 10 may be cleaned prior to the growth of the device 11 such that there is a better electrical connection between the wafer 10 and the device 11.

It will be appreciated that the device 11 may be grown prior to the fabrication of the shadow wall 13. For example, the device 11 may be grown, and then the layer of resist 14 deposited on the surface of the mask 12 and device 11. The steps 1 to 4 would then follow.

In step 6, deposition of material 4 takes place. Again, the hollow shadow wall 13 prevents material 4 from being deposited in the shadow regions on the device 11, however allows material 4 to be deposited in regions which are not within these shadow regions.

It will be appreciated that additional structures may be used for this method of fabrication. For example, alignment markers may be used to align the smart wall fabrication patterns to the gap 17 in the mask 12 in which the device 11 is to be grown. Such structures are known in the art.

Figure 4:
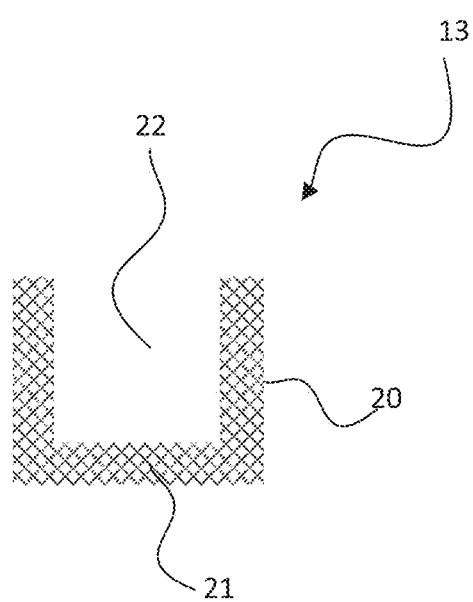
FIG. 4 shows a schematic diagram of a hollow shadow wall.

As can be seen from FIGS. 1 and 3, the shadow walls 13 created using this method are hollow. That is, they are comprised of vertical walls 20, a base 21, and the internal cavity 22, as shown by the wall 13 cross-section in FIG. 4. The internal cavity 22 is a volume enclosed by the vertical walls 20 but which contains no wall material. As such, the full volume of the cavity 15 is not filled with the wall material when the layer of wall material 16 is deposited.

The thickness of the vertical walls 20 of the shadow wall 13 is determined by the thickness of the layer of wall material 16 deposited in step 3 of the method of FIGS. 1 and 3. Wall thicknesses may be between 20 nm and 70 nm, for example. It has been found that structures are more stable if the walls are between 50 nm and 70 nm thick. Walls may be fortified to allow for thinner walls, as described below. The required thickness of the walls is determined by the shadow requirements, since thinner walls allow for the formation of sharper features of the shadow walls 13, and thus sharper or smaller shadow regions on the device 11 during material deposition.

It will be appreciated that other methods may be used to fabricate hollow shadow walls 13. For example, a layer of wall material may be deposited over the wafer 10 and then the shadow walls 13 etched from the wall material layer. A layer of electron beam resist may be deposited on top of the layer of wall material, which subsequently has the required pattern of the wall drawn into it via, for example, electron beam lithography, before the pattern is etched in the layer of wall material. Other methods, such as mechanical patterning may be used to define the shape of the shadow walls.

Further fabrication steps may be required after the deposition of the material 4. The shadow walls used during material deposition may present problems in these later stages of fabrication. Thus, it is advantageous for the shadow walls to be easily removable from the substrate once they are no longer needed in the fabrication process.

The hollow nature of the shadow walls 13 allows them to be removed after material deposition—addressing point (2) above. Shadow walls 13 composed of monolithic pieces of material, i.e. shadow walls 13 which do not contain an internal cavity 22, are very difficult to remove from the wafer 10. Very tall and thin vertical walls 20 can be fabricated, so the vertical walls of the shadow walls 13 have a large aspect ratio and are fragile. The vertical walls 20 of the shadow walls 13 may, for example, be up to 2 μm tall and as thin as 20 nm. These large aspect ratio vertical walls have the advantage that they are easily removed from the substrate when they have served their purpose. That is, when the deposition of material 4 for which the shadow walls 13 were built has occurred, the vertical walls 20 of the shadow walls 13 are removed. This prevents the walls 13 from causing complications for further fabrication steps.

To remove the shadow walls 13, the substrate is placed in a liquid bath and ultrasonication is performed. Other mechanical methods may alternatively be used to remove the shadow walls 13. The fragility of the walls 13 allows for their removal. Since narrower vertical walls 20 form more fragile shadow walls 13 than thicker vertical walls 20, it is advantageous to have thinner vertical walls 20 in order to allow for easier removal. However, thinner vertical walls 20 result in shadow walls 13 which are less stable during material 4 deposition, so a compromise should be reached between stability and ease of removal.

When the walls 13 are removed, they leave behind only a thin footprint on the wafer 10 corresponding to the base 21 of the shadow wall 13. Since the walls of the shadow wall 13 are very thin, this base layer 21 does not obstruct further fabrication of the structure.

Figure 5A:
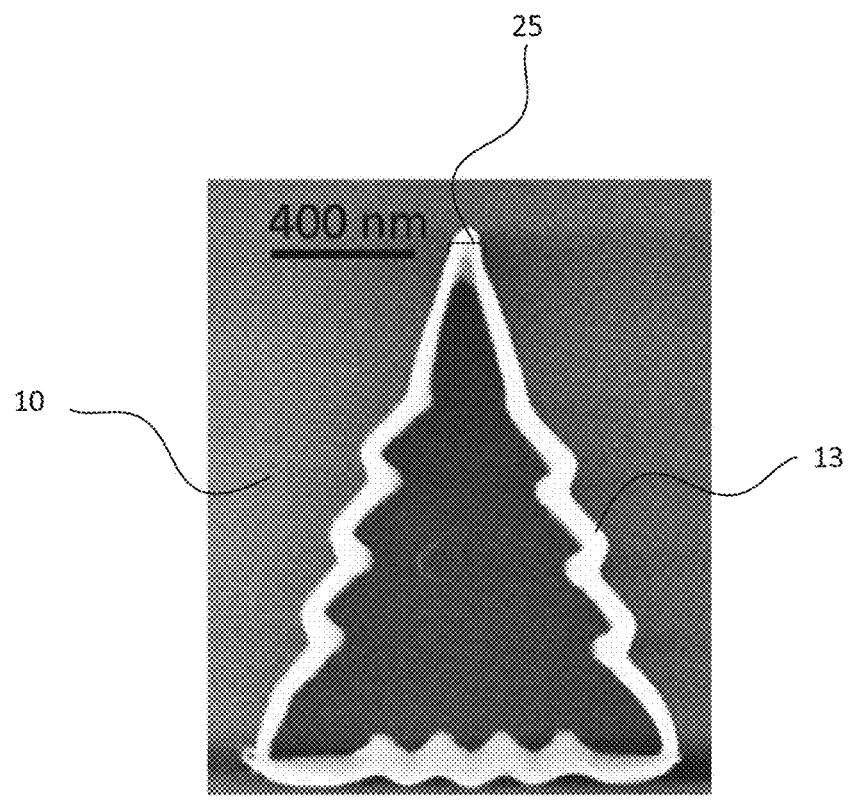
FIG. 5A shows a top view of an example of a hollow shadow wall having fortifying serrated edges.

The shadow walls 13 may be fortified, that is, their rigidity may be increased without increasing the thickness of the layer of deposited wall material, i.e. without increasing the thickness of the vertical walls 20. This may be achieved by designing the vertical walls 20 of the shadow walls 13 to have a 'wavy pattern'. An example is shown in FIG. 5A. As can be seen, the three edges of the triangular shadow wall 13 are not straight sections joining the three corners of the triangle. Rather, the three edges are serrated. They may comprise short sections which are concertinaed to form a zigzag-like pattern, such as those shown in FIG. 5A. Vertical walls 20 which are shaped in this way are more stable during the deposition of material 4, so thinner vertical walls 20 can be used, resulting in more fragile structures. For example, the wall thickness may be 20 nm. Fortified walls are advantageous when the vertical walls 20 are long.

Figure 5B:
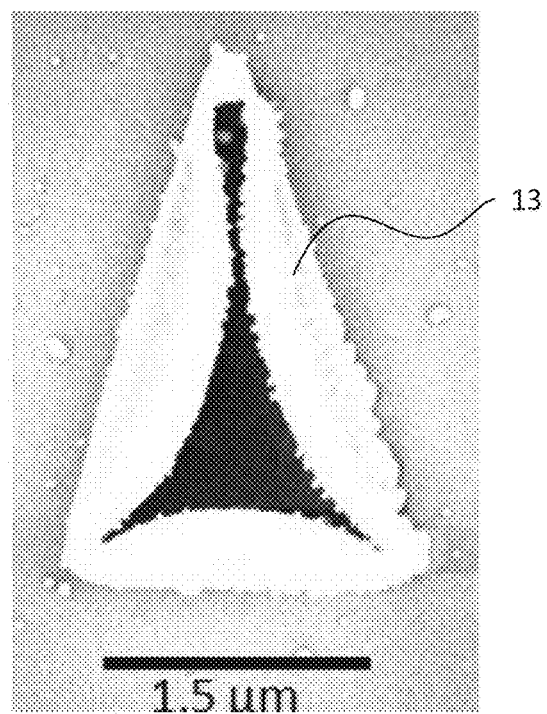
FIG. 5B shows a top view of an example of the smart wall without fortification effect.

Serrated shadow walls 13, such as that shown in FIG. 5A, are more rigid than straight-walled shadow walls 13. Straight-walled shadow walls 13 are mechanically stable since they are more flexible. That is, when vibrations are applied to the wafer in order to remove the structure, such as during ultrasonication, straight vertical walls may bend to try to compensate for the vibrations they are experiencing. This makes it more difficult for the shadow walls 13 to be removed from the substrate 10. However, the serrated shadow walls 13 are more rigid so easier to remove by ultrasonication. They do not bend in the same way as straight-walled shadow walls 13 under the influence of vibrations. FIG. 5B shows a straight-walled hollow shadow wall. Strains in the wall material are released through bending of the vertical walls 20 inwards as can be seen in the top-down view of FIG. 5B.

In some embodiments, shadow walls containing no cavity, i.e. shadow walls which are completely filled with wall material, may be designed to have serrated edges. These shadow walls may be created by depositing a layer of wall material on the wafer 10, and then etching to remove the unwanted wall material from the wafer 10.

As described above, the use of serrated shadow walls 13 allows the vertical walls 20 to be thinner. This has another advantage in that the shadows created by the shadow walls 13 are more well defined than with those with thicker vertical walls 20. Taking the example shadow wall 13 shown in FIG. 5A, the tip 25 of the serrated shadow wall 13 may be about 70 nm in width. In contrast, the width of a straight-walled shadow wall 13 of similar dimensions to that of FIG. 5A, such as that in FIG. 5B, may be about 150 nm. Since the tip width is much smaller in the thinner walled shadow walls 13, more well-defined shadow areas are able to be created. Other features of the shadow wall 13 are able to be much smaller when thinner vertical walls 20 are used to form the shadow walls 13.

Even sharper features may be achieved by using feature engineering. For example, additional segments are introduced to improve the sharpness of the shadow wall 13.

Figure 6A:
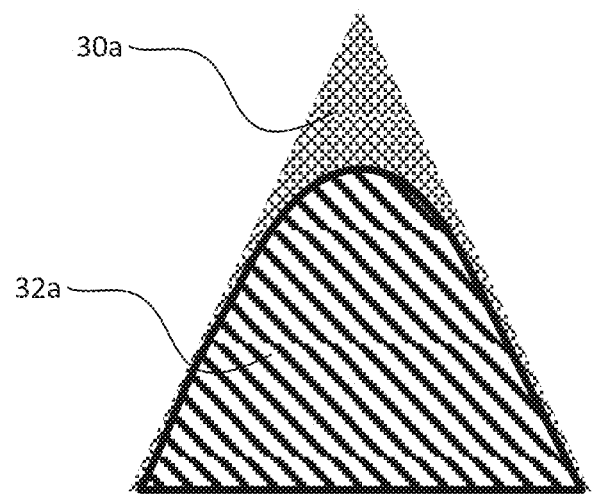
FIGS. 6A, 6B, and 6C show schematic diagrams to illustrate by example the principles of small feature engineering for smart walls.

FIG. 6A shows a design shape 30a and an actual shape 32a of a shadow wall 13 fabricated via the method of FIG. 1. The design shape 30a is the shape which it is desired that the deposition material be channelled past during material deposition such that the desired deposition pattern is formed on the device 11. That is, the design shape 30*a* is the ideal shape of the shadow wall 13 and the shape of the cavity 15 in which the shadow wall 13 is fabricated. The actual shape 32*a* is the shape of the shadow wall 13 which is fabricated.

Figure 6B:
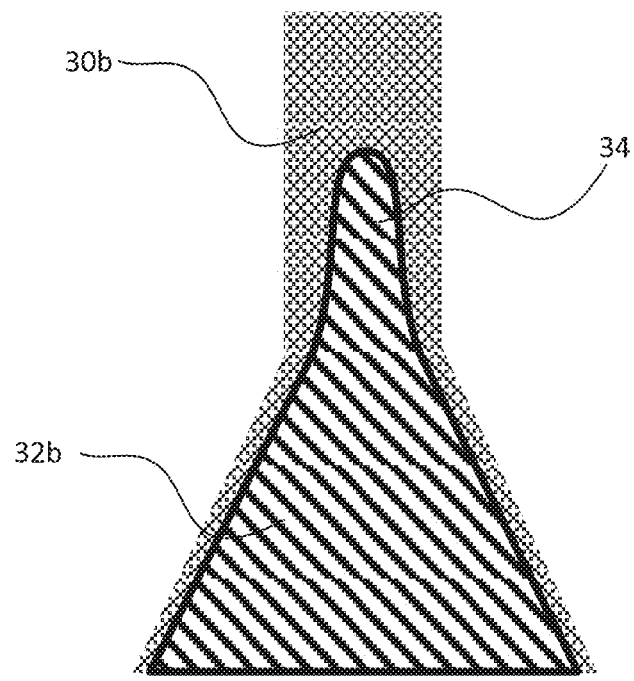

FIG. 6B shows the design shape 30*b* and actual shape 32*b* of a shadow wall 13 which has been modified in order to have sharper features. This is achieved through edge engineering. In this example, an additional segment 34 has been introduced. The additional segment 34 produces an elongated tip of the actual shape 32*b*. This elongated tip may be about 40 nm in width. Thus, the additional segment 34 creates sharper features than can be achieved without it. The use of thinner or sharper features allows smaller shadows to be created on the device 11, so smaller areas which are protected from the material 4 deposition.

Figure 6C:
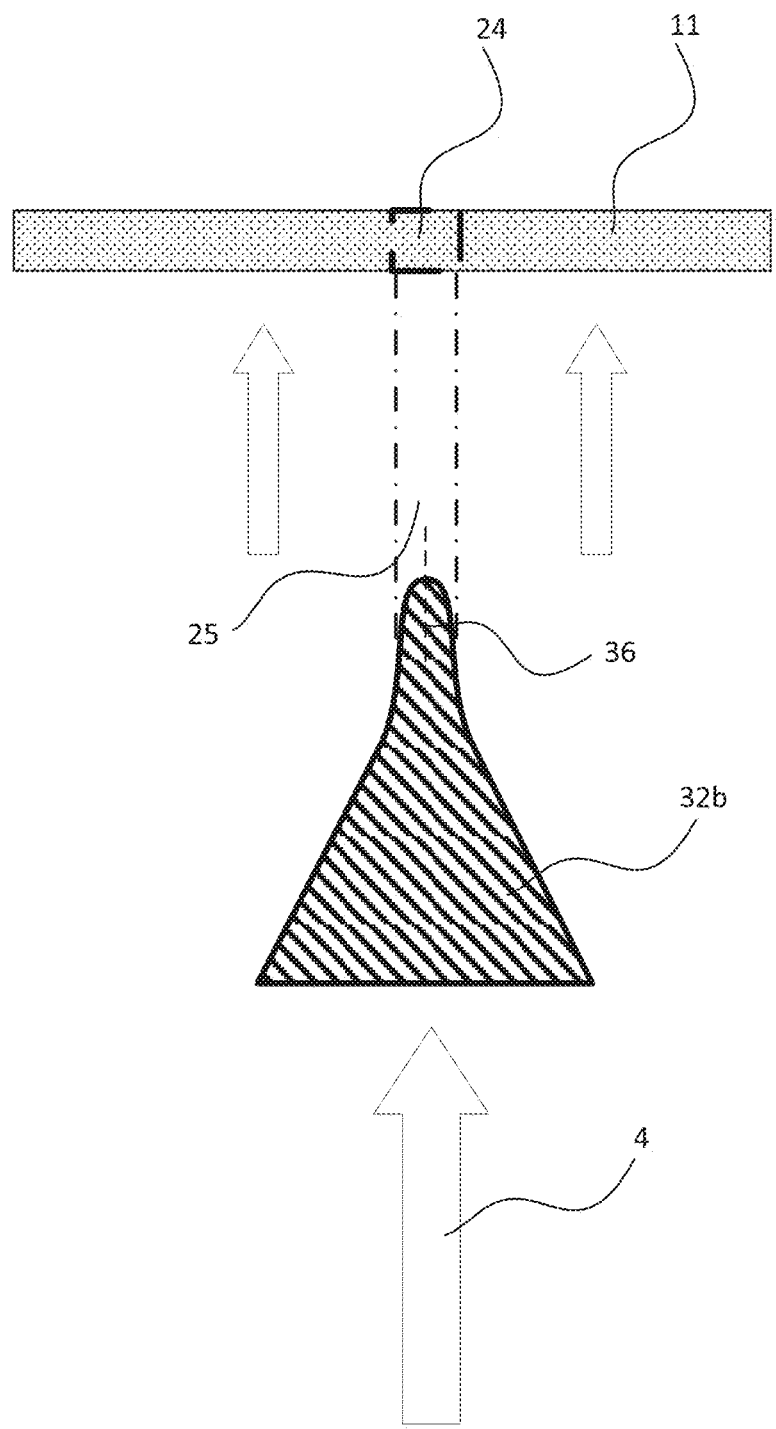

FIG. 6C shows the narrow shadow region formed by the thin elongated tip of the shadow wall 13 with actual shape 32*b*. A tip axis 36 extends along the axis of elongation of the elongated tip. The material 4 is deposited in a direction indicated by the arrow, i.e. substantially parallel to the tip axis 36 of the elongated tip region, and in the direction from the widest part of the shadow wall to the narrow tip region. The narrow tip of the shadow wall forms shadow region 24 on the device 11, so blocks the material 4 from travelling through the exclusion zone 25 to the device 11. The material 4 is deposited on the device 11 in the areas which are outside of the shadow region 24. The elongated tip narrows the tip of the shadow wall, so forming a smaller shadow region 24 on the device 11 than if no elongated tip were used on a shadow wall of similar size and shape.

This allows a narrow junction region of nanowire to be formed between two nearby regions of the nanowire that are partially covered with semiconductor (for example).

To form the actual shape 32*a*, 32*b* of the shadow wall 13 the side-surfaces forming the boundary of the cavity 15 in which the shadow wall 13 is created, as described above, taper inwards towards each other, thus forming a triangular shape. In the example of FIG. 6A, the two side-surfaces meet at a point as defined by the deign shape 30*a*. In the example of FIG. 6B, the two-side-surfaces taper inwards to the region in which the elongated tip is to be formed, as defined by the design shape 30*b*.

After the deposition of the material 4 has taken place, post-fabrication stages may follow. An example post-fabrication stage is etching of the deposited material 4. The deposited material 4 may be removed from outside the active region, for example, form the surface of the wafer 10. Reactive iron etching may be used to remove the aluminium film, for example.

By way of further example, an example use-case will now be described in which smart walls are used in conjunction with selective area growth of nanowires. However, as noted above, the present disclosure is not limited in this respect, and the nanowires that form the nanostructure to be patterned can instead be prepared externally and transferred to the substrate for patterning.

Epitaxial semiconductor-superconductor materials are a promising platform for gatable low-dissipation superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for gatable superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons. Regarding the latter approach, this has been able to achieve a very high-quality SE/SU interface. However, with this approach, the SE/SU nanowires to form part of a network have to be individually grown and, once grown, individually placed on an insulating material to form the actual network. Thus, scaling up this approach to larger networks presents very significant challenges.

Example embodiments of the disclosed technology provide a solution to the problem of scalability by combining SAG semiconductors with a superconducting phase.

Figure 7:
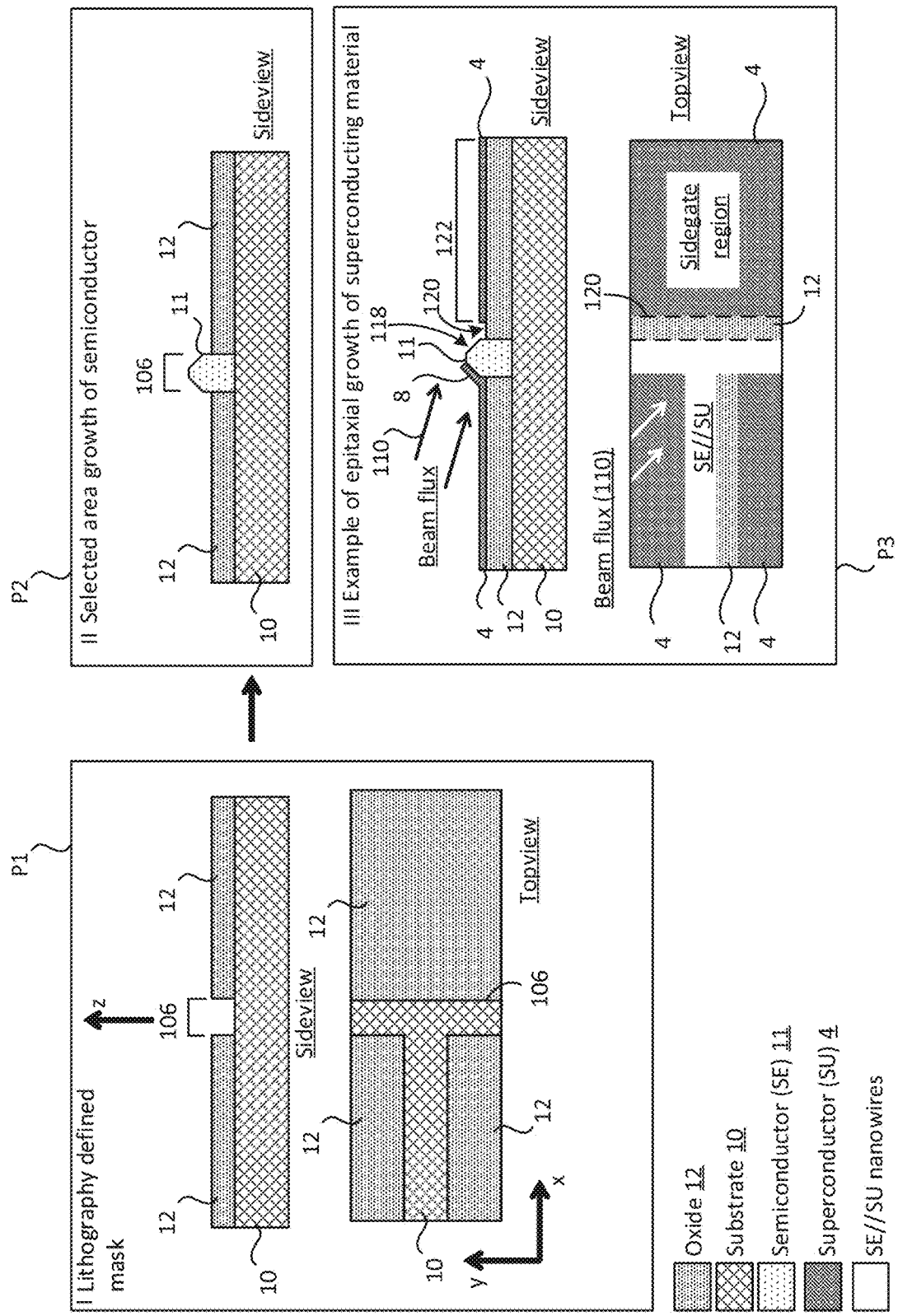
FIG. 7 shows a schematic illustration of a method of fabricating a network of SE/SU nanowires.

With reference to FIG. 7, an example three-phase fabrication method will now be described. The fabrication method can be used to create a network of SE/SU nanowires, which in turn can for example form the basis of a quantum circuit (e.g. for a quantum computer) or other mixed semiconductor-superconductor platform. In particular, the method is particularly suitable for fabricating a SE/SU nanowire network capable of hosting stable MZMs, with no or significantly reduced soft gap decoherence, which can form the basis of fault-free topological quantum computations.

It is noted, however, that although the material platform is relevant for quantum computing, the gatable superconducting electronics it provides may well have other applications outside of or which are not directly related to quantum computing, particularly in contexts where low energy dissipation is required.

As will become apparent, because the SE/SU nanowire network is created using SAG, an entire nanowire network can be fabricated as a whole on an insulating wafer. The substrate and the nanowire can be incorporated directly into the final product, without any need to transfer the nanowires to a different surface. Thus, the method is significantly more saleable than the existing approaches.

1) Masking Phase

In a first phase P1 (masking phase) a patterned layer of amorphous material 12 (amorphous dielectric mask) is formed on top of an insulating substrate 10. A side-view and a top-view of the substrate 10 with the dielectric mask 12 are shown on the left-hand side of FIG. 7. The substrate 10 can be formed of any suitable substrate material such as InP (Indium Phosphide), and is an insulating substrate in the described examples. In the described examples, the dielectric material 12 is an silicon oxide but it can be any amorphous dielectric material that facilitates SAG in a second phase P2 of the fabrication method (see below).

The mask layer is patterned in that the mask layer 12 is formed so as to leave narrow strips of the substrate—in a desired region 106—exposed (i.e. not covered by the oxide 12). The pattern in this context refers to the structure of the desired region 106, which will ultimately become the structure of the nanowire network, as it is this exposed region 106 in which SE nanowires are grown. Accordingly, the size and structure of the nanowires matches the size and structure of the exposed region 106. Although only one exposed region 106 is shown in FIG. 7, nanowires can be grown simultaneously in multiple regions and all description pertaining to the desired region 106 applies equally to multiple such regions. Accordingly, the structure of an entire nanowire network can be defined by the structure of the exposed region(s). In this example, the strips and hence the resulting nanowires have a width of the order of tens or hundreds of nanometers.

The mask layer 12 can be formed so as to leave the desired region 106 exposed in any suitable manner. For example, a uniform, continuous layer of oxide can be deposited on the substrate 10, and the exposed region 106 can then be formed by selectively etching away the oxide 12 from the desired region 106 (in this case, it is the etching that defines the eventual nanowire network structure). As another example, the oxide layer 12 can be selectively deposited on the wafer 10 with a mask used to prevent deposition of the oxide 12 in the desired regions 106 (in this case, it is the mask that defined the eventual nanowire network structure).

The SAG nanowires are defined along high symmetry in-plane crystal orientations on the substrate, which also gives well-defined faceting of the nanowires. This makes the SU/SE interface flat, potentially atomically flat, and well defined.

2) SAG Phase

In the second phase P2, namely the SAG phase, a semiconductor material 11 is selectively grown within the desired regions 106, on top of the exposed portion of the wafer 10. An example is illustrated at the top right of FIG. 7, at which a side-view of the wafer 10 is shown. Due to the patterning of the oxide layer 12, the selectively grown semiconductor 11 forms in-plane nanowires (that is, nanowires lying in the plane of the wafer 10).

SAG is a crystal growth method. SAG refers to localized growth of semiconductor in exposed regions of the substrate, with growth conditions selected to prevent such growth on the dielectric mask itself. This can be based on Chemical Beam Epitaxy (CBE), Molecular Beam Epitaxy (MBE), or Metal-Organic Chemical Vapour Deposition (MOCVD), for example. In the context of semiconductors, SAG refers to a particular class of epitaxial semiconductor growth (and is also referred to as selective area epitaxy), in which a patterned dielectric mask is used to define the intended structure of the semiconductor material to be grown (a form of lithography). The SAG process is tuned such that semiconductor growth occurs only on regions of the substrate that are not covered by the dielectric mask, and not on the dielectric mask itself. This is quite different from other deposition/growth processes, such as bottom up growth (in which no mask is used) and uniform deposition (epitaxial or otherwise) in which material is uniformly deposited across a surface irrespective its material composition (as in phase P3—see below). SAG requires careful tuning to achieve the desired selective semiconductor growth.

Any suitable SAG process can be used in the second phase P2 to create the desired SE nanowires in the exposed region 106.

SAG per-se is known, and is therefore not discussed in further detail herein. For further description of SAG, see, e.g., G. J Davies Proc. SPIE 2140, Epitaxial Growth Processes, 58 (May 11, 1994); doi: 10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/1.105026; P. Aseev et al. Nano Letters 2019 19 (1), 218-227, doi: 10.1021/acs.nanolett.8b03733.

Suffice it to say that the SAG phase P2 is such that, at the end of that phase, the semiconductor material 11 fills the desired region 106 (that is, the region 106 in which the wafer 10 is not covered by the oxide mask 12) but does not extend to any great extent, in the plane of the wafer 10 (xy-plane hereafter), beyond the boundaries of the desired region 106 as defined the oxide layer 12. However, as can be seen, it does extend outwardly in a direction normal (perpendicular) to the plane of the wafer 10 (z-direction hereafter) so as to protrude outwardly of the oxide mask 12. That is, the semiconductor material 11 extends a greater distance from the wafer 10 than the oxide layer 12 in the z-direction. In this manner, the semiconductor material 11 forms nanowires lying substantially in the plane of the substrate 12 (in-place nanowires).

The semiconductor material 11 can be any suitable semiconductor material, such as Indium arsenide (InAs). The SAG semiconductor 11 can for example be confined 2DEG (two-dimensional electron gas) semiconductor or single material semiconductor.

3) Superconductor Growth Phase

In a third phase P3 (superconductor growth phase) a layer of superconducting material 4 is grown using a particle beam 110. Herein, a superconducting material means a material that exhibits superconducting properties at least under certain conditions. An example of such a material is aluminum (Al). In the following examples, the superconductor is grown epitaxially in phase P3, and the superconductor growth phase P3 may be referred to as an epitaxial growth phase in this context. However, the technology is not limited in this respect, and it may be possible to achieve the intended result via non-epitaxial superconductor growth in phase P3.

The superconducting material 4 can be grown in phase P3 using molecular beam epitaxy (MBE) or electron gun epitaxy, for example.

At least part of the superconductor layer 4 is deposited on top of the SE nanowire 11 such that this part of the superconductor layer 4 (labelled 8 in FIG. 7) is in direct contact with the SE nanowire 11. That is, such that the SE nanowire 11 is at least partially covered with superconducting material.

This is also a form of epitaxy, but it is not SAG. In particular, in the epitaxial growth phase P3, epitaxial growth does occur on the oxide layer 12, as well as on the SE nanowires 11.

The beam can be angled in substantially the z-direction such that essentially all of the exposed surfaces of the oxide layer 12 and the SE material 11 are covered by the SU layer 4. However, in this example, the particle beam 110 is incident on the wafer 10 with a non-zero angle of incidence relative to the z-direction (deposition angle). As a consequence of this non-zero deposition angle and the protruding structure of the SE nanowire 11, the SE nanowire 11 is only partially coated by the superconductor layer 4; that is, a part of the SE nanowire (labelled 118) is not coated by the superconductor material. The bulk of the oxide layer 12 is also coated by the superconductor layer 4, however due to the angle of the incoming beam 110 and the protruding structure of the SE nanowires 11, small regions of the oxide layer 12 (shadow regions) immediately adjacent the protruding SE nanowires 11 are left exposed, i.e. not coated by the SU material. One such shadow region is labelled 120 in FIG. 7. The shadow region 120 separates the SE material 11 from a portion of the SU layer 4 in a "sidegate" region 122. The portion of the SU layer 4 in the sidegate region 122 can be used to form a gate for controlling the SE nanowires 11, or (more likely) the SU material can be etched away from this region and replaced with a more suitable gate material, as in the example below. Either way, the shadow gap 120 ensures the gate operates as intended. Forming the gap 120 using such "in-situ" patterning in the SU epitaxy phase P3 (as described above) ensures that material does not need to be etched away too close to the delicate nanowires 11.

This is an example of the basic process where the superconductor is deposited as a uniform layer, but where a "shadow" from the selective area grown material is used to form a gap between the semiconductor and the superconductor. In this particular case, the superconductor, that does not touch the semiconductor, can be used as a side gate or etched away and replaced with a more suitable gate material, while the superconductor that are in direct contact with the semiconductor are used to induce superconductivity.

The bottom right of FIG. 7 shows both a side-view and a top-view of the wafer 10 at the end of the third phase P3. Note that, in the top-view, the part 8 of the superconductor layer 4 that partially coats the SE nanowire 11 is not distinguished from the uncoated part 118 of SE nanowires 11; rather the combined nanowire structure formed of the nanowires 11 and the portion of the superconductor material 8 that (partially) covers those nanowires (i.e. that is in direct contact therewith) is depicted as a single element, labelled SE//SU. This combined structure is similarly represented and labelled in later figures, and herein references to "SE/SU nanowires" or "SE//SU nanowires" refer to the SE nanowires 11 and the SU material 8 that (partially) covers the SE nanowires 11, unless otherwise indicated.

Figure 8:
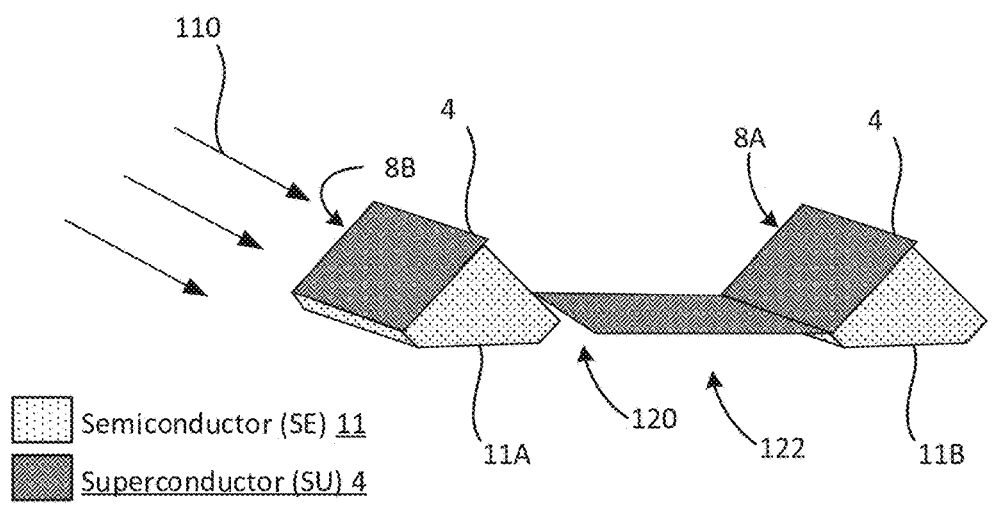
FIG. 8 shows a schematic perspective view of SAG SE nanowires in an epitaxial growth phase, in which superconducting material is deposited on and around the nanowires.

To further aid illustration, FIG. 8 shows a schematic perspective view of first and second nanowires 11A, 11B during the third phase P3, which are partially coated by respective parts 8A, 8B of the superconductor layer 4. A shadow gap 120 of the kind described above is shown, which is immediately adjacent the first nanowire 11A and separates the first nanowire 11A from a portion of the semiconductor layer 4 in a sidegate region 122, in the manner described above.

The SAG phase P2 and superconductor growth phase P3 can be conducted in a vacuum chamber, preferably without moving the wafer 10 between phases. These phases can be carried out under high vacuum or ultra-high vacuum conditions and those vacuum conditions may be maintained between phases. Among other things, this ensures a clean SE/SU interface, free from unwanted impurities.

As will be appreciated, both the SAG semiconductor growth of phase P2 and the superconductor growth of phase P3 require carefully calibrated conditions to get within respective "growth windows" for these two phases, and thereby achieve the desired semiconductor and superconductor growth respectively. Depending on the material type, the growth conditions, temperature and flux needs to chosen carefully. For example, for MBE (which can be used in both the semiconductor SAG phase P2 and superconductor growth phase P3), the substrate generally needs to be heated to temperatures of around 500° C. or more to clean the surface for native oxide. However, in the SE SAG growth phase P2 and SU growth phase P3, the respective temperature windows in which the desired growth takes place is dependent on the composition of the SE material 11 and SU material 4 respectively. The superconductor is grown/deposited in-situ, without breaking vacuum. In this way the surface of SAG is not oxidized in air and remain clean until the SU is put on, which ensure a clean SE-SU interface.

Example Use-Cases

Using SAG as a basis for gatable superconductor network desirably involves an insulated wafer, and that the selective area grown material can carry induced superconductivity.

The wafer 10 and oxide layer 12 on which the SE//SU nanowire network is grown can be incorporated in the end-product, such as a quantum circuit or quantum computer, along with the SE/SU nanowire network, without transferring the nanowires from the wafer on which they were originally fabricated.

Embodiments of the disclosed technology include topologically protected quantum computing circuits that comprise networks of nanowires formed using such mixed semiconductor and superconductor regions.

Figure 9:
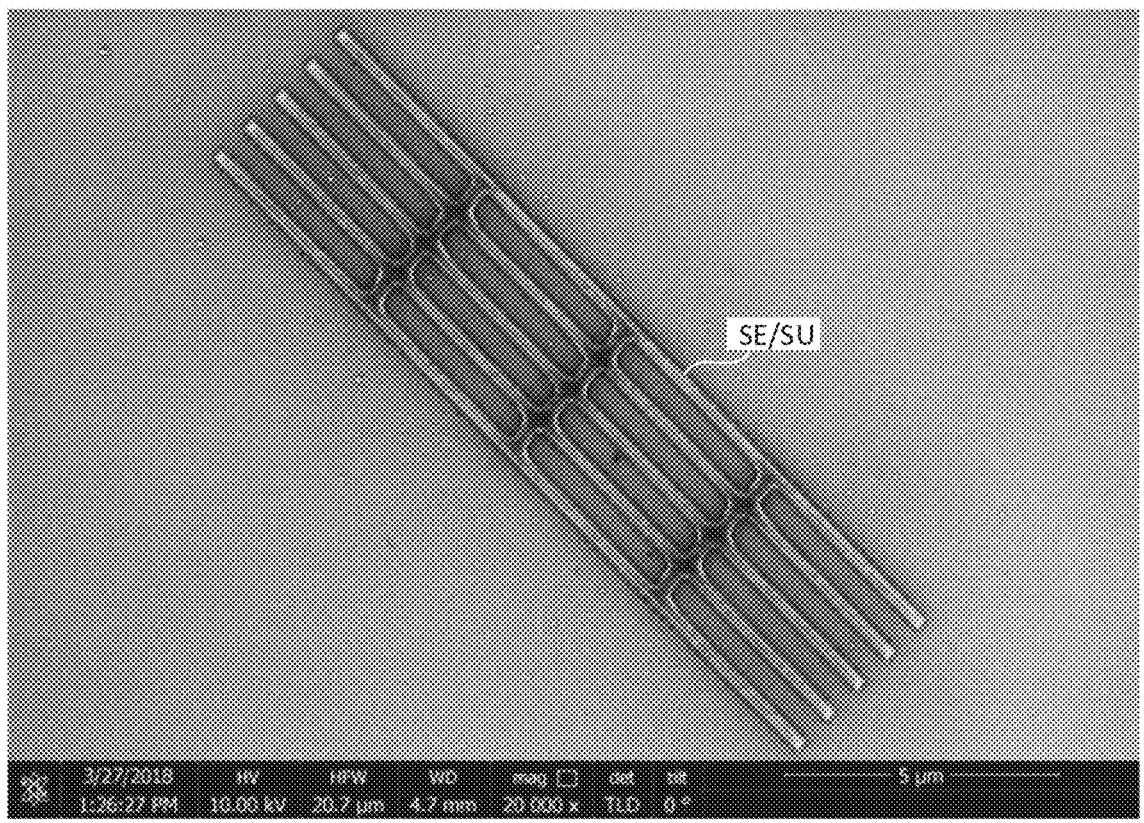
FIG. 9 shows a top view image of a SAG InAs nanowire network on an GaAs substrate.

In FIG. 9, for instance, a wire-pattern consisting of InAs nanowires grown on an insulating GaAs substrate is shown. In particular, FIG. 9 shows the fabrication of a complicated network based on one-dimensional nanowire network. The network is a SAG InAs nanowire network formed on an GaAs substrate.

Figure 10:
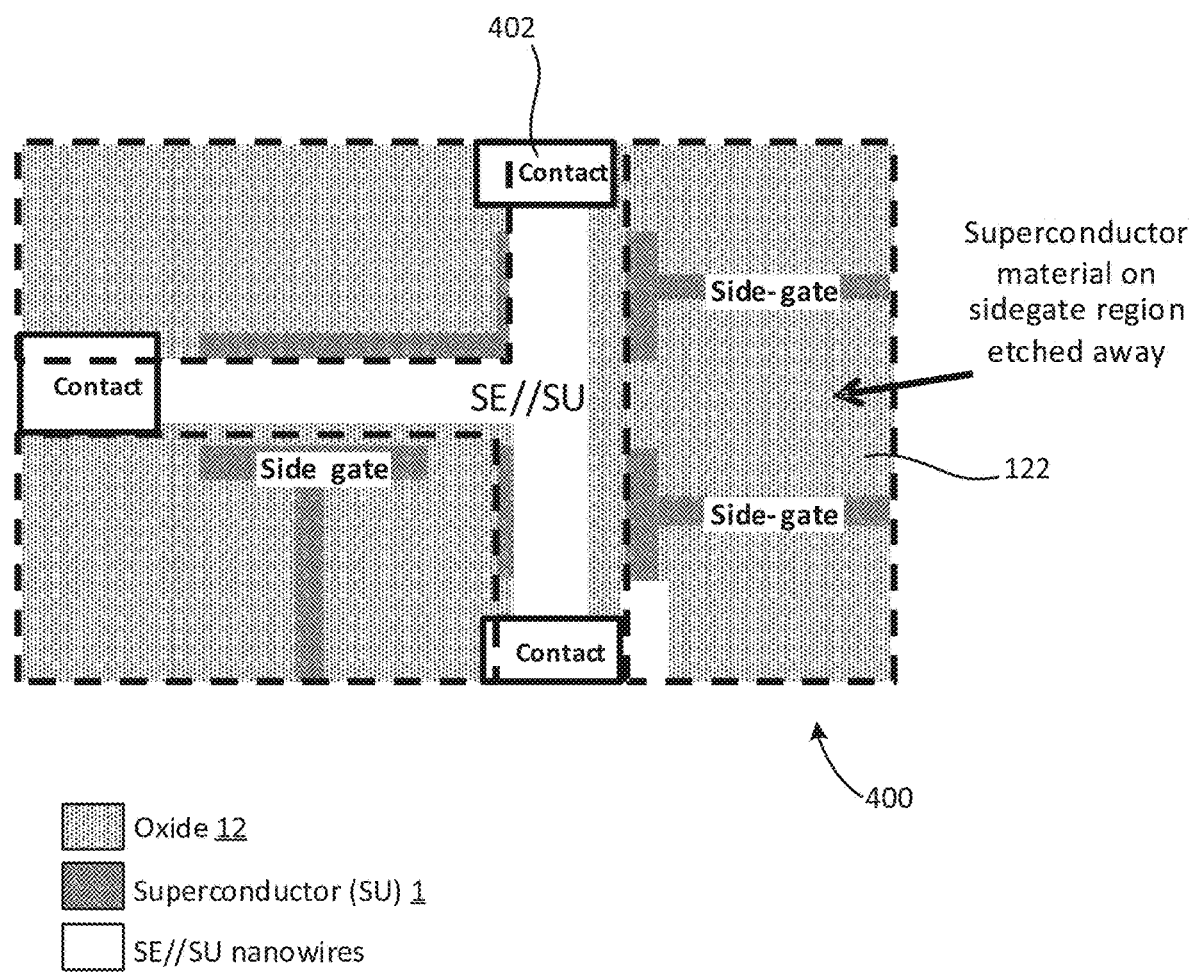
FIG. 10 shows a schematic top view of a quantum circuit comprising SE/SU nanowires and side-gate regions.

FIG. 10 shows a schematic top-view of a T-shaped SE//SU nanowire structure, which has been fabricated using the method described above, to form a quantum circuit 400. Contacts 402 of the quantum circuit 402 have been added to the SE//SU nanowires, to allow electrical connection therewith. Gating regions 4 are shown, in which most of the SU material 4 has been etched away, e.g. to be replaced with a different gating material (not shown), in order to form a side gate for manipulating the SE//SU nanowires, and—in the context of topological quantum computing, for example—for manipulating Majorana zero modes hosted by the SE//SU nanowires, in order to perform quantum computations.

According to a first aspect of the present invention, there is provided a method of selectively patterning a device structure, the method comprising: forming, on a substrate, a hollow shadow wall, the hollow shadow wall being formed of a base lying on a surface of the substrate, and one or more side walls connected to the base, the one or more side walls extending away from the surface of the substrate and around the base to define an internal cavity of the hollow shadow wall; selectively patterning a device structure supported by the substrate adjacent to the shadow wall, by using a deposition beam to selectively deposit a layer of deposition material on the device structure, the deposition beam having a non-zero angle of incidence relative to a normal to the surface of the substrate and an orientation in the plane of the substrate's surface, such that the shadow wall prevents deposition on a surface portion of the device structure within a shadow region defined by the shadow wall; and removing the one or more side walls of the hollow shadow wall once the device structure has been selectively patterned.

The hollow shadow wall may be formed by deposition of at least one wall material in an area of the substrate's surface left exposed by a partial resist layer on the substrate's surface, the partial resist layer having a top-surface and at least one inner side-surface extending from the top-surface to the substrate's surface, so as to create a boundary of the exposed area, wherein the partial resist layer may be removed once the hollow shadow wall has been formed.

The hollow shadow wall may be formed from at least one deposited layer of the wall material, which covers the top-surface of the partial resist layer, the inner side-surface of the partial resist layer and the exposed area of the substrate's surface, the one or more side walls of the hollow shadow wall comprising the wall material covering the inner side-surface of the partial resist layer prior to its removal and the base of the hollow shadow wall comprising the wall material covering the exposed area of the substrate's surface, wherein the wall material covering the top-surface of the partial resist layer may be removed with the partial resist layer leaving the hollow shadow wall supported by the substrate.

The inner-side surface of the partial resist layer may have at least one serrated region, such that a corresponding region of the one or more side walls exhibits corresponding serrations, which increase the rigidity of the one or more side walls.

The one or more side walls may surround the entirety of the base in a plane in which the surface of the substrate substantially lies.

The one or more side walls may be removed via a mechanical process.

A mask layer may be formed on the substrate, the mask layer leaving at least one device region of the substrate exposed in which the device structure is to be grown, the partial resit layer being deposited on the mask layer with the exposed area of the substrate's surface for forming the hollow shadow wall being adjacent to the exposed device region, the device being grown from device material in the exposed region via selective area growth of the device material.

According to a second aspect of the present invention, there is provided a method of selectively patterning a device component, the method comprising: forming on a surface of a substrate a partial layer of resist which leaves at least one area of the substrate surface exposed, the partial resist layer having a top-surface lying substantially parallel to the substrate's surface and an inner side-surface extending from the top-surface to the substrate's surface, so as to create a boundary of the exposed area where the side-surface meets the substrate's surface; forming a shadow wall in the exposed area from wall material deposited on the inner side-surface of the resist layer, the wall material extending to the exposed area of the substrate surface for supporting the shadow wall when the resist layer is removed which surrounds it; removing the partial resist layer from the substrate thereby leaving the shadow wall supported by the substrate; and using a deposition beam to selectively deposit a layer of deposition material on a device component supported by the substrate adjacent to the shadow wall, the deposition beam having a non-zero angle of incidence relative to a normal to the surface of the substrate and an orientation in the plane of the substrate's surface, such that the shadow wall prevents deposition on a surface portion of the device component within a shadow region defined by the shadow wall.

The wall material may only partially fill a cavity defined by the inner side-surface, such that the shadow wall has an internal cavity.

The wall material may form a layer over the exposed area.

At least a portion of the inner-side surface may be serrated so as to increase the rigidity of the shadow wall.

The one or more side walls of the shadow wall may be removed after the selective deposition of the deposition material, the one or more side walls extending away from the surface of the substrate prior to their removal to define the internal cavity.

The one or more shadow walls may be removed mechanically.

The boundary of the exposed area may have two edges which taper inwards towards each other in a plane lying substantially parallel to the substrate's surface.

The edges may taper inwardly to an elongated tip region of the exposed area.

The elongated tip region may extend along a tip axis and define the shadow region during selective deposition of the deposition material, the shadow region having a width dependent on a width of the elongated tip region perpendicular to the tip axis.

The deposition material may be a superconductor and/or the device component formed of a semiconductor material.

According to a third aspect of the present invention, there is provided a method of selectively patterning a device structure, the method comprising: forming a shadow wall on a surface of a substrate, the shadow wall comprising one or more side walls extending away from the surface of the substrate, the one or more side walls having at least one serrated region which increases the rigidity of the one or more side walls; using a deposition beam to selectively deposit a layer of deposition material on a device structure supported by the substrate adjacent to the shadow wall, the deposition beam having a non-zero angle of incidence relative to a normal to the surface of the substrate and an orientation in the plane of the substrate's surface, such that the shadow wall prevents deposition on a surface portion of the device structure within a shadow region defined by the shadow wall, thereby selectively patterning the device structure.

The shadow wall may be a hollow shadow wall comprising a base on the substrate's surface to which the one or more side walls are connected.

The one or more side walls may extend around the base to define an internal cavity of the shadow wall.

The disclosed methods, apparatus, and systems should not be construed as limiting in any way. The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of selectively patterning a device structure, the method comprising:
    forming, on a substrate, a hollow shadow wall having a hollow interior cavity with no wall material, the hollow shadow wall being formed of a base lying on a surface of the substrate, and one or more side walls connected to the base, the one or more side walls extending away from the surface of the substrate and around the base to define an internal cavity of the hollow shadow wall;
    selectively patterning a device structure supported by the substrate adjacent to the shadow wall, by using a deposition beam to selectively deposit a layer of deposition material on the device structure, the deposition beam having a non-zero angle of incidence relative to a normal to the surface of the substrate and an orientation in a plane of the substrate's surface, such that the shadow wall prevents deposition on a surface portion of the device structure within a shadow region defined by the shadow wall; and
    removing the one or more side walls of the hollow shadow wall once the device structure has been selectively patterned.

2. The method of claim 1, wherein the hollow shadow wall is formed by deposition of at least one wall material in an area of the substrate's surface left exposed by a partial resist layer on the substrate's surface, the partial resist layer having a top-surface and at least one inner side-surface extending from the top-surface to the substrate's surface, so as to create a boundary of an exposed area, wherein the partial resist layer is removed once the hollow shadow wall has been formed.

3. The method of claim 2, wherein the hollow shadow wall is formed from at least one deposited layer of the wall material, which covers the top-surface of the partial resist layer, the inner side-surface of the partial resist layer and the exposed area of the substrate's surface, the one or more side walls of the hollow shadow wall comprising the wall material covering the inner side-surface of the partial resist layer prior to its removal and the base of the hollow shadow wall comprising the wall material covering the exposed area of the substrate's surface, wherein the wall material covering the top-surface of the partial resist layer is removed with the partial resist layer leaving the hollow shadow wall supported by the substrate.

4. The method of claim 3, wherein the inner-side surface of the partial resist layer has at least one serrated region, such that a corresponding region of the one or more side walls exhibits corresponding serrations, which increase the rigidity of the one or more side walls.

5. The method of claim 1, wherein the one or more side walls surround the entirety of the base in a plane in which the surface of the substrate substantially lies.

6. The method of claim 1, wherein the one or more side walls are removed via a mechanical process.

7. The method of claim 2, wherein a mask layer is formed on the substrate, the mask layer leaving at least one device region of the substrate exposed in which the device structure is to be grown, the partial resist layer being deposited on the mask layer with the exposed area of the substrate's surface for forming the hollow shadow wall being adjacent to the exposed device region, the device being grown from device material in the exposed region via selective area growth of the device material.

8. A method of selectively patterning a device component, the method comprising:
  forming on a surface of a substrate a partial layer of resist so as to form at least one exposed area of a substrate surface exposed, the partial resist layer having a top-surface lying substantially parallel to the surface of the substrate and an inner side-surface extending from the top-surface to the surface of the substrate, so as to create a boundary of the at least one exposed area where the inner side-surface meets the substrate's surface;
  forming a shadow wall having a hollow interior cavity with no wall material in the exposed area from wall material deposited on the inner side-surface of the partial resist layer, the wall material extending to the exposed area of the substrate surface for supporting the shadow wall after the resist layer is removed;
  removing the partial resist layer from the substrate thereby leaving the shadow wall supported by the substrate; and
  using a deposition beam to selectively deposit a layer of deposition material on a device component supported by the substrate adjacent to the shadow wall, the deposition beam having a non-zero angle of incidence relative to a normal to the surface of the substrate and an orientation in a plane of the substrate's surface, such that the shadow wall prevents deposition on a surface portion of the device component within a shadow region defined by the shadow wall.

9. A method according to claim 8, wherein the wall material only partially fills a cavity defined by the inner side-surface, such that the shadow wall has an internal cavity.

10. A method according to claim 9, wherein the wall material forms a layer over the exposed area.

11. A method according to claim 9, wherein at least a portion of the inner-side surface is serrated so as to increase a rigidity of the shadow wall.

12. A method according to claim 8, comprising a step of removing one or more side walls of the shadow wall after the selective deposition of the deposition material, the one or more side walls extending away from the surface of the substrate prior to their removal to define the internal cavity.

13. A method according to claim 12, wherein the one or more shadow walls are removed mechanically.

14. A method according to claim 8, wherein the boundary of the exposed area has two edges which taper inwards towards each other in a plane lying substantially parallel to the substrate's surface.

15. A method according to claim 14, wherein the edges taper inwardly to an elongated tip region of the exposed area.

16. A method according to claim 15, wherein the elongated tip region extends along a tip axis and defines the shadow region during selective deposition of the deposition material, the shadow region having a width dependent on a width of the elongated tip region perpendicular to the tip axis.

17. A method according to claim 8, wherein the deposition material is a superconductor and/or the device component formed of a semiconductor material.

18. A method of selectively patterning a device structure, the method comprising:
  forming a shadow wall having a hollow interior cavity with no wall material on a surface of a substrate, the shadow wall comprising one or more side walls extending away from the surface of the substrate, the one or more side walls having at least one serrated region that increases a rigidity of the one or more side walls;
  using a deposition beam to selectively deposit a layer of deposition material on a device structure supported by the substrate adjacent to the shadow wall, the deposition beam having a non-zero angle of incidence relative to a normal to the surface of the substrate and an orientation in a plane of the substrate's surface, such that the shadow wall prevents deposition on a surface portion of the device structure within a shadow region defined by the shadow wall, thereby selectively patterning the device structure.

19. The method of claim 18, wherein the shadow wall is a hollow shadow wall comprising a base on the substrate's surface connected to the one or more side walls.

20. The method of claim 19, wherein the one or more side walls extend around the base to define an internal cavity of the shadow wall.

* * * * *